United States Patent
Tatsumi et al.

(10) Patent No.: US 10,697,058 B2
(45) Date of Patent: Jun. 30, 2020

(54) SINGLE-CRYSTAL DIAMOND, METHOD OF PRODUCING SAME, TOOL INCLUDING SINGLE-CRYSTAL DIAMOND, AND COMPONENT INCLUDING SINGLE-CRYSTAL DIAMOND

(71) Applicant: Sumitomo Electric Industries, Ltd., Osaka-shi (JP)

(72) Inventors: Natsuo Tatsumi, Itami (JP); Yoshiki Nishibayashi, Itami (JP); Hitoshi Sumiya, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 520 days.

(21) Appl. No.: 15/327,439

(22) PCT Filed: Jul. 22, 2015

(86) PCT No.: PCT/JP2015/070860
§ 371 (c)(1),
(2) Date: Jan. 19, 2017

(87) PCT Pub. No.: WO2016/013588
PCT Pub. Date: Jan. 28, 2016

(65) Prior Publication Data
US 2017/0158514 A1 Jun. 8, 2017

(30) Foreign Application Priority Data
Jul. 22, 2014 (JP) .................. 2014-148857

(51) Int. Cl.
C23C 16/02 (2006.01)
C23C 16/27 (2006.01)
(Continued)

(52) U.S. Cl.
CPC .............. *C23C 16/02* (2013.01); *B23B 27/14* (2013.01); *B23B 27/20* (2013.01); *B24B 53/047* (2013.01);
(Continued)

(58) Field of Classification Search
CPC ......... C23C 16/02; C23C 16/27; C01B 32/25; B23B 27/14; B23B 27/20; B24B 53/047;
(Continued)

(56) References Cited

U.S. PATENT DOCUMENTS

2004/0182308 A1    9/2004   Scarsbrook et al.
2006/0231015 A1    10/2006  Meguro et al.
(Continued)

FOREIGN PATENT DOCUMENTS

CN    103354845 A    10/2013
JP    2004-503461 A   2/2004
(Continued)

OTHER PUBLICATIONS

Li et al., "Fabrication of Low Dislocation Density Single crystalline Diamond via Two step Epitaxial lateral overgrowth", Crystals 2017, 7, 114. (Year: 2017).*

Tallaire et al., "Dislocations and impurities introduced from etch-pits at the epitaxial growth resumption of diamond," Diamond and Related Materials, Elsevier Science Publishers, Amsterdam, NL, vol. 20, No. 7, Apr. 27, 2011 pp. 875-881.
(Continued)

*Primary Examiner* — Jonathan C Langman
(74) *Attorney, Agent, or Firm* — Baker Botts L.L.P.; Michael A. Sartori

(57) ABSTRACT

In an X-ray topography image for a crystal growth main surface of a single-crystal diamond, a group of crystal defect points are gathered, each of the crystal defect points being a tip point of a crystal defect line reaching the crystal growth
(Continued)

main surface, the crystal defect line representing a line in which a crystal defect exists. Further, in the single-crystal diamond, a plurality of crystal defect line-like gathered regions exist in parallel. In the plurality of crystal defect line-like gathered regions, groups of crystal defect points are gathered to extend in the form of lines in a direction angled by not more than 30° relative to one arbitrarily specified direction. Accordingly, a single-crystal diamond is provided which is used suitably for a cutting tool, a polishing tool, an optical component, an electronic component, a semiconductor material, and the like.

13 Claims, 5 Drawing Sheets

(51) Int. Cl.
*C30B 29/04* (2006.01)
*C01B 32/25* (2017.01)
*C30B 25/20* (2006.01)
*B23B 27/20* (2006.01)
*B23B 27/14* (2006.01)
*B24B 53/047* (2006.01)
*C30B 25/18* (2006.01)
*C30B 29/68* (2006.01)

(52) U.S. Cl.
CPC .............. *C01B 32/25* (2017.08); *C23C 16/27* (2013.01); *C30B 25/186* (2013.01); *C30B 25/20* (2013.01); *C30B 29/04* (2013.01); *C30B 29/68* (2013.01); *C01P 2002/70* (2013.01)

(58) Field of Classification Search
CPC ....... C30B 25/186; C30B 25/20; C30B 29/04; C30B 29/68; C01P 2002/70
See application file for complete search history.

(56) References Cited

U.S. PATENT DOCUMENTS

| | | |
|---|---|---|
| 2007/0054124 A1 | 3/2007 | Gill et al. |
| 2007/0148079 A1 | 6/2007 | Scarsbrook et al. |
| 2008/0044339 A1 | 2/2008 | Scarsbrook et al. |
| 2009/0127506 A1 | 5/2009 | Twitchen et al. |
| 2013/0143022 A1* | 6/2013 | Schreck .............. C23C 16/0281 428/220 |
| 2014/0004319 A1* | 1/2014 | Dhillon ................ C30B 25/105 428/195.1 |
| 2015/0191850 A1 | 7/2015 | Nishibayashi et al. |

FOREIGN PATENT DOCUMENTS

| | | | |
|---|---|---|---|
| JP | 2006-518699 A | 8/2006 | |
| JP | 2006-315942 A | 11/2006 | |
| JP | 2009-518273 A | 5/2009 | |
| JP | 2013-053050 A | 3/2013 | |
| WO | WO2014027123 * | 4/2004 | ............. C30B 25/02 |
| WO | 2014/168053 A1 | 10/2014 | |

OTHER PUBLICATIONS

Martineau et al., "High crystalline quality single crystal chemical vapour deposition diamond," Journal of Physics: Condensed Matter, Institute of Physics Publishing, Bristol, GB, vol. 21, No. 36, Sep. 9, 2009, 364205 (8 pages).

Yamamoto et al., "X-ray topography of homo-epitaxial diamond," Extended Abstracts (The 51st Spring Meeting, 2004); The Japan Society of Applied Physics and Related Societies, Mar. 28, 2004, No. 2, p. 635.

International Search Report in counterpart International Application No. PCT/JP2015/070860, dated Oct. 27, 2015.

* cited by examiner

SINGLE-CRYSTAL DIAMOND, METHOD OF PRODUCING SAME, TOOL INCLUDING SINGLE-CRYSTAL DIAMOND, AND COMPONENT INCLUDING SINGLE-CRYSTAL DIAMOND

TECHNICAL FIELD

The present invention relates to: a single-crystal diamond used suitably for a cutting tool, a polishing tool, an optical component, an electronic component, a semiconductor material and the like; a method of producing the single-crystal diamond; a tool including the single-crystal diamond; and a component including the single-crystal diamond.

BACKGROUND ART

Diamond has excellent characteristics such as high heat conductivity, high carrier mobility, high dielectric breakdown electric field, low dielectric loss, and the like, and has been widely used for a cutting tool, an abrasion-resistant tool, and the like due to its incomparable high hardness. Conventionally, natural single-crystal diamond or single-crystal diamond synthesized by a high-temperature/high-pressure method has been used widely; however, a thick, freestanding single-crystal diamond can be synthesized by chemical vapor deposition (CVD) in recent years, so that the above-described various applications are expected.

Wide researches have been conducted to achieve high quality of such a CVD single-crystal diamond. For example, in Yamamoto et al., "X-ray topography of homo-epitaxial diamond", Extended Abstracts (The 51st Spring Meeting, 2004); The Japan Society of Applied Physics and Related Societies, Mar. 28, 2004, No. 2, p. 635 (Non-Patent Document 1), distribution of defects such as dislocations is observed through X-ray topography for a homo-epitaxial diamond obtained by CVD. Moreover, Japanese National Patent Publication No. 2004-503461 (Patent Document 1) discloses a high-quality single-crystal CVD diamond layer having a thickness of more than 2 mm as well as a method of generating the single-crystal CVD diamond layer, wherein the single-crystal CVD diamond layer is synthesized through CVD after decreasing a defect density in a surface of a diamond base serving as a seed substrate in order to obtain a single-crystal CVD diamond having an excellent electronic property.

CITATION LIST

Patent Document

PTD 1: Japanese National Patent Publication No. 2004-503461

Non Patent Document

NPD 1: Yamamoto et al., "X-ray topography of homo-epitaxial diamond", Extended Abstracts (The 51st Spring Meeting, 2004); The Japan Society of Applied Physics and Related Societies, Mar. 28, 2004, No. 2, p. 635

SUMMARY OF INVENTION

Technical Problem

If a single-crystal diamond (hereinafter, also referred to as "CVD single-crystal diamond") grown through CVD as disclosed in each of Yamamoto et al., "X-ray topography of homo-epitaxial diamond", Extended Abstracts (The 51st Spring Meeting, 2004); The Japan Society of Applied Physics and Related Societies, Mar. 28, 2004, No. 2, p. 635 (Non-Patent Document 1) and Japanese National Patent Publication No. 2004-503461 (Patent Document 1) is employed for a cutting tool, an abrasion-resistant tool, or the like, such a CVD single-crystal diamond has a lower chipping resistance and is therefore more likely to be chipped than the natural single-crystal diamond and the single-crystal diamond (hereinafter, also referred to as "high-temperature/high-pressure single-crystal diamond") grown by the high-temperature/high-pressure method. This leads to a short life of the cutting tool or abrasion-resistant tool, disadvantageously. Moreover, if the CVD single-crystal diamond disclosed in each of Yamamoto et al., "X-ray topography of homo-epitaxial diamond", Extended Abstracts (The 51st Spring Meeting, 2004); The Japan Society of Applied Physics and Related Societies, Mar. 28, 2004, No. 2, p. 635 (Non-Patent Document 1) and Japanese National Patent Publication No. 2004-503461 (Patent Document 1) is employed for an optical component, an electronic component, a semiconductor material, or the like, chippings and cracks are generated at a dicing cross section when dicing into an optical component, an electronic component, a semiconductor material, or the like. Accordingly, device area cannot be effectively obtained, disadvantageously.

It is an object to solve the above problems and provide: a single-crystal diamond used suitably for a cutting tool, a polishing tool, an optical component, an electronic component, a semiconductor material and the like; a method of producing the single-crystal diamond; a tool including the single-crystal diamond; and a component including the single-crystal diamond.

Solution to Problem

In a single-crystal diamond according to a certain embodiment of the present invention, in an X-ray topography image for a crystal growth main surface of the single-crystal diamond, a plurality of crystal defect line-like gathered regions exist in parallel, and in the plurality of crystal defect line-like gathered regions, groups of crystal defect points are gathered to extend in a form of lines in a direction angled by not more than 30° relative to one arbitrarily specified direction, each of the crystal defect points being a tip point of a crystal defect line reaching the crystal growth main surface, the crystal defect line representing a line in which a crystal defect exists.

A method of producing a single-crystal diamond according to another embodiment of the present invention includes: preparing a diamond seed crystal having seed crystal defect line-like gathered regions in which groups of seed crystal defect points are gathered to extend in a form of lines at a main surface of the diamond seed crystal; and growing a single-crystal diamond by chemical vapor deposition on the main surface of the diamond seed crystal.

Advantageous Effects of Invention

In this way, there can be provided: a single-crystal diamond used suitably for a cutting tool, a polishing tool, an optical component, an electronic component, a semiconductor material and the like; a method of producing the single-crystal diamond; a tool including the single-crystal diamond; and a component including the single-crystal diamond.

DESCRIPTION OF EMBODIMENTS

Figure 1:
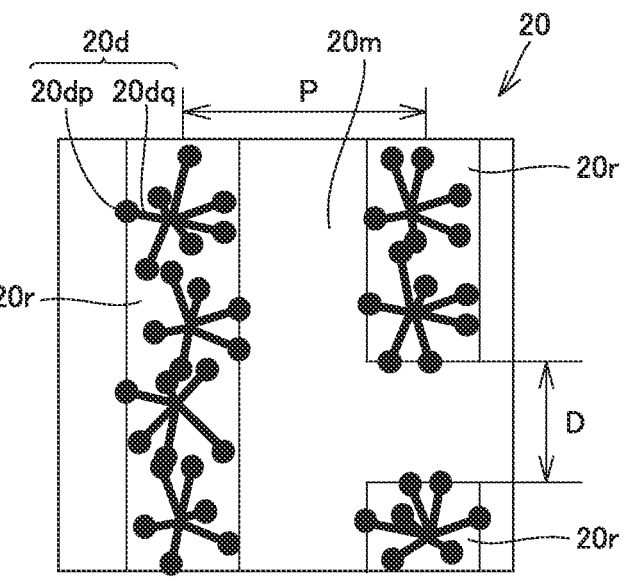
FIG. 1 is a schematic view showing an exemplary X-ray topography image for a crystal growth main surface of a single-crystal diamond according to an embodiment of the present invention.

Description of Embodiments of the Present Invention

In a single-crystal diamond according to a certain embodiment of the present invention, in an X-ray topography image for a crystal growth main surface of the single-crystal diamond, a group of crystal defect points are gathered, each of the crystal defect points being a tip point of a crystal defect line reaching the crystal growth main surface, the crystal defect line representing a line in which a crystal defect exists.

Since occurrence of large chipping is suppressed due to stress relaxation provided by the multiplicity of crystal defect lines, the single-crystal diamond of the present embodiment is used suitably for a cutting tool, a polishing tool, an optical component, an electronic component, a semiconductor material, and the like.

In the single-crystal diamond according to a certain embodiment of the present invention, in an X-ray topography image for a crystal growth main surface of the single-crystal diamond, a plurality of crystal defect line-like gathered regions exist in parallel, and in the plurality of crystal defect line-like gathered regions, groups of crystal defect points are gathered to extend in a form of lines in a direction angled by not more than 30° relative to one arbitrarily specified direction, each of the crystal defect points being a tip point of a crystal defect line reaching the crystal growth main surface, the crystal defect line representing a line in which a crystal defect exists.

In the single-crystal diamond of the present embodiment, since the plurality of crystal defect line-like gathered regions exist in parallel in which the groups of the crystal defect points, each of which is a tip point of the crystal defect line reaching the crystal growth main surface, are gathered to extend in the form of lines in the direction angled by not more than 30° relative to the one arbitrarily specified direction, occurrence of large chipping is suppressed by stress relaxation provided by the multiplicity of crystal defect lines and it is possible to control a direction in which the single-crystal diamond is less likely to be chipped by way of the plurality of crystal defect line-like gathered regions existing in parallel and extending in the form of lines in the direction angled by not more than 30° relative to the one arbitrarily specified direction. Hence, the single-crystal diamond of the present embodiment is used suitably for a cutting tool, a polishing tool, an optical component, an electronic component, a semiconductor material, and the like.

In the single-crystal diamond of the present embodiment, two or more crystal defect line-like gathered regions exist for every 1 mm in a direction perpendicular to a direction in which the crystal defect line-like gathered regions extend in the form of lines, and an interval between the crystal defect line-like gathered regions is not more than 500 μm in the direction in which the crystal defect line-like gathered regions extend in the form of lines. Here, the direction in which the crystal defect line-like gathered regions extend in the form of lines refers to the above-described one specified direction, which is a direction of an average of directions in which the plurality of crystal defect line-like gathered regions extend. In such a single-crystal diamond, since two or more crystal defect line-like gathered regions exist for every 1 mm in the direction perpendicular to the direction in which the crystal defect line-like gathered regions extend in the form of lines and the interval between the crystal defect line-like gathered regions is not more than 500 μm in the direction in which the crystal defect line-like gathered regions extend in the form of lines, occurrence of large chipping is suppressed by stress relaxation provided by the multiplicity of crystal defect lines and it is possible to control a direction in which the single-crystal diamond is less likely to be chipped by way of the high density of crystal defect line-like gathered regions $20r$ existing in parallel in the direction angled by not more than 30° relative to the one arbitrarily specified direction.

In the single-crystal diamond of the present embodiment, the crystal defect line-like gathered regions include five or more crystal defect line-like gathered regions each having a long length of not less than 300 μm for every 1 cm$^2$ at the crystal growth main surface. Since such a single-crystal diamond includes, for every 1 cm$^2$ at the crystal growth main surface, the five or more crystal defect line-like gathered regions each having a long length of not less than 300 μm, occurrence of chipping in the single-crystal diamond is suppressed and the strength of the whole of the single-crystal diamond is increased. In view of this, the crystal defect line-like gathered regions can include, for every 1 cm$^2$ at the main surface, 20 or more crystal defect line-like gathered regions each having a longer length of not less than 500 μm.

In the single-crystal diamond of the present embodiment, a density of the crystal defect points can be more than 20 mm$^{-2}$. Since the density of the crystal defect points is more than 20 mm$^{-2}$ in such a single-crystal diamond, occurrence of large chipping is suppressed due to stress relaxation provided by the high density of the crystal defect lines corresponding to the high density of the crystal defect points. Further, in the single-crystal diamond of the present embodiment, a density of the crystal defect points can be more than 300 mm$^{-2}$. Since the density of the crystal defect points is more than 300 mm$^{-2}$ in such a single-crystal diamond, occurrence of large chipping is more suppressed due to stress relaxation provided by the higher density of the crystal defect lines corresponding to the higher density of the crystal defect points.

In the single-crystal diamond of the present embodiment, a density of combined dislocation points of the crystal defect points can be more than 20 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. Since the density of the combined dislocation points, which are tip points of combined dislocations reaching the crystal growth main surface, is more than 20 mm$^{-2}$ and the effect of stress relaxation provided by the combined dislocations is large in such a single-crystal diamond, occurrence of large chipping is suppressed further. Furthermore, in the single-crystal diamond of the present embodiment, a density of combined dislocation points of the crystal defect points can be more than 30 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. Since the density of the combined dislocation points, which are the tip points of the combined dislocations reaching the crystal growth main surface, is more than 30 mm$^{-2}$ and the effect of stress relaxation provided by the combined dislocations is larger in such a single-crystal diamond, occurrence of large chipping is suppressed further.

The single-crystal diamond of the present embodiment can include a plurality of single-crystal diamond layers. Since the single-crystal diamond includes the plurality of single-crystal diamond layers, formation of the crystal defect lines is facilitated, thus further suppressing occurrence of large chipping.

The single-crystal diamond of the present embodiment includes a plurality of single-crystal diamond layers, wherein the crystal defect line is newly generated or branched at an interface between the single-crystal diamond layers, and a density of the crystal defect points of the crystal growth main surface can be higher than a density of the crystal defect points of a main surface opposite to the crystal growth main surface. Since the crystal defect lines are newly generated or branched at the interface between the single-crystal diamond layers in such a single-crystal diamond, the crystal defect points of the crystal growth main surface are increased as the number of the single-crystal diamond layers is increased, with the result that the density of the crystal defect points of the crystal growth main surface becomes higher than the density of the crystal defect points of the main surface opposite to the crystal growth main surface, thus further increasing chipping resistance.

The single-crystal diamond of the present embodiment includes a plurality of single-crystal diamond layers, wherein the crystal defect line is newly generated, disappeared, branched or merged at an interface between the single-crystal diamond layers, and densities of the crystal defect points of the crystal growth main surface and the crystal defect points of a crystal growth main surface opposite to the crystal growth main surface can be higher than a density of the crystal defect points at the interface between the single-crystal diamond layers. Since the crystal defect lines are branched or merged at the interface between the single-crystal diamond layers in such a single-crystal diamond, the number of the crystal defect points of the crystal growth main surface and the number of the crystal defect point of the opposite crystal growth main surface are increased as the number of the single-crystal diamond layers is increased. Accordingly, the densities of the crystal defect points of the crystal growth main surface and the crystal defect points of the opposite crystal growth main surface become higher than the density of the crystal defect points of the interface between the single-crystal diamond layers, whereby occurrence of large chippings of both the main surfaces is suppressed, chipping resistances of both the main surfaces becomes high, and strength becomes high.

The single-crystal diamond of the present embodiment can contain not less than 1 ppm of nitrogen atoms as impurity atoms. Such a single-crystal diamond contains not less than 1 ppm of nitrogen atoms as impurity atoms, and the nitrogen atoms are clustered nitrogen atoms providing starting points of chipping or cracking, rather than isolated substitutional nitrogen atoms providing no starting points of chipping or cracking; however, occurrence of large chipping is suppressed due to stress relaxation provided by the multiplicity of crystal defect lines. Accordingly, the single-crystal diamond of the present embodiment thus containing not less than 1 ppm of nitrogen atoms as impurity atoms is used suitably for applications such as: a cutting tool such as a cutting bite or an end mill; a wear-resisting tool such as a dresser or a wire drawing die; and a heat sink. Furthermore, in order to further suppress occurrence of large chipping by disrupting progress of chipping, the single-crystal diamond of the present embodiment can contain not less than 3 ppm of nitrogen atoms as impurity atoms, and can contain not less than 30 ppm of nitrogen atoms. However, if the concentration of the nitrogen atoms is too high while the density of the crystal defect lines is high, stress is not relaxed before occurrence of chipping. Hence, the concentration of the nitrogen atoms can be preferably not more than 1000 ppm.

The single-crystal diamond of the present embodiment can contain less than 1 ppm of nitrogen atoms as impurity atoms. Since the single-crystal diamond contains only less than 1 ppm of nitrogen atoms as impurity atoms, the concentration of the nitrogen atoms, which are heteroelement atoms disrupting expansion of chipping when a strong stress is applied to a particular portion, is low. Hence, large chipping extending in a long distance is more likely to occur; however, the expansion of chipping is disrupted by the multiplicity of crystal defect lines and stress relaxation provided by the multiplicity of crystal defect lines, thereby suppressing occurrence of large chipping. Accordingly, the single-crystal diamond of the present embodiment thus containing less than 1 ppm of nitrogen atoms as impurity atoms is used suitably for applications such as: an optical component such as a window material or a lens; a sensor; and a semiconductor substrate. Furthermore, as the range in which the above-described effect is obtained greatly, the single-crystal diamond of the present embodiment can contain not more than 0.3 ppm of nitrogen atoms and not more than 30 ppb of nitrogen atoms as impurity atoms. However, if there is no nitrogen atom, chipping of the single-crystal diamond cannot be suppressed, so that not less than 0.01 ppb of nitrogen atoms can be preferable.

In the single-crystal diamond of the present embodiment, a transmittance for 400-nm light can be not more than 60% when the single-crystal diamond has a thickness of 500 μm. Here, the "transmittance for light when the thickness of the single-crystal diamond is 500 μm" refers to a transmittance for light measured when the thickness thereof is 500 μm, or a transmittance of light obtained by measuring a transmittance of light measured when the thickness thereof is not 500 µm and converting the measured transmittance into a transmittance when the thickness is 500 µm. For precise evaluation of the transmittance for light, it is preferable to polish a surface to attain a surface scattering of not more than 2%. Due to a synergetic effect provided by the crystal defects and the impurity atoms, such a single-crystal diamond absorbs light having a wavelength of not more than 400 nm, with the result that transmittance for the light having such a wavelength is decreased. In the single-crystal diamond in which transmittance for 400-nm light is not more than 60% when the thickness thereof is 500 µm, occurrence of large chipping is suppressed.

A method of producing a single-crystal diamond according to another embodiment of the present invention includes: preparing a diamond seed crystal having seed crystal defect line-like gathered regions in which groups of seed crystal defect points are gathered to extend in a form of lines at a main surface of the diamond seed crystal; and growing a single-crystal diamond by chemical vapor deposition on the main surface of the diamond seed crystal.

In the method of producing the single-crystal diamond according to the present embodiment, by growing the single-crystal diamond by chemical vapor deposition on the main surface of the diamond seed crystal having the seed crystal defect line-like gathered regions in which the groups of seed crystal defect points are gathered to extend in the form of lines at the main surface of the diamond seed crystal, there can be provided a single-crystal diamond in which a plurality of crystal defect line-like gathered regions exist in parallel, and in the plurality of crystal defect line-like gathered regions, groups of crystal defect points are gathered to extend in a form of lines in a direction angled by not more than 30° relative to one arbitrarily specified direction, each of the crystal defect points being a tip point of a crystal defect line reaching the crystal growth main surface. In such a single-crystal diamond, occurrence of large chipping is suppressed by stress relaxation provided by the multiplicity of crystal defect lines and it is possible to control a direction in which the single-crystal diamond is less likely to be chipped by way of the plurality of crystal defect line-like gathered regions existing in parallel and extending in the form of lines in the direction angled by not more than 30° relative to the one arbitrarily specified direction. Hence, the single-crystal diamond is used suitably for a cutting tool, a polishing tool, an optical component, an electronic component, a semiconductor material, and the like.

In the method of producing the single-crystal diamond according to the present embodiment, two or more seed crystal defect line-like gathered regions exist for every 1 mm in a direction perpendicular to a direction in which the seed crystal defect line-like gathered regions extend in the form of lines, and an interval between the seed crystal defect line-like gathered regions can be not more than 500 µm in the direction in which the seed crystal defect line-like gathered regions extend in the form of lines. Here, the direction in which the seed crystal defect line-like gathered regions extend in the form of lines refers to the above-described one specified direction, which is a direction of an average of directions in which the plurality of seed crystal defect line-like gathered regions extend. In the method of producing such a single-crystal diamond, since the two or more seed crystal defect line-like gathered regions exist for every 1 mm in the direction perpendicular to the direction in which the seed crystal defect line-like gathered regions extend in the form of lines and the interval between the seed crystal defect line-like gathered regions is not more than 500 µm in the direction in which the seed crystal defect line-like gathered regions extend in the form of lines, there can be obtained, by chemical vapor deposition, a single-crystal diamond in which two or more crystal defect line-like gathered regions exist for every 1 mm in a direction perpendicular to a direction in which the crystal defect line-like gathered regions extend in the form of lines and an interval between the crystal defect line-like gathered regions is not more than 500 µm in the direction in which the crystal defect line-like gathered regions extend in the form of lines. Hence, the single-crystal diamond is obtained in which occurrence of large chipping is suppressed by stress relaxation provided by the multiplicity of crystal defect lines and it is possible to control a direction in which the single-crystal diamond is less likely to be chipped by way of the high density of the crystal defect line-like gathered regions existing in parallel and extending in the form of lines in the direction angled by not more than 30° relative to the one arbitrarily specified direction.

In the method of producing the single-crystal diamond according to the present embodiment, the seed crystal defect line-like gathered regions can include five or more seed crystal defect line-like gathered regions each having a long length of not less than 300 µm for every 1 cm$^2$ at the main surface. In the method of producing the single-crystal diamond, the five or more seed crystal defect line-like gathered regions each having a long length of not less than 300 µm are included for every 1 cm$^2$ at the main surface, thereby suppressing occurrence of chipping in the single-crystal diamond to be grown and improving the strength of the whole of the single-crystal diamond. In view of this, the seed crystal defect line-like gathered regions can include, for every 1 cm$^2$ at the main surface, 20 or more seed crystal defect line-like gathered regions each having a longer length of not less than 500 µm.

In the method of producing the single-crystal diamond according to the present embodiment, a density of the seed crystal defect points can be more than 10 mm$^{-2}$. In the method of producing the single-crystal diamond, the density of the seed crystal defect points is more than 10 mm$^{-2}$, thereby obtaining, by chemical vapor deposition, a single-crystal diamond in which a density of crystal defect points, which are tip points of crystal defect lines reaching a crystal growth main surface, is more than 20 mm$^{-2}$. Hence, there is obtained a single-crystal diamond in which occurrence of large chipping is suppressed due to stress relaxation provided by the high density of the crystal defect lines. Further, in the method of producing the single-crystal diamond according to the present embodiment, a density of the seed crystal defect points can be more than 100 mm$^{-2}$. In the method of producing such a single-crystal diamond, the density of the seed crystal defect points is more than 100 mm$^{-2}$, thereby obtaining, by chemical vapor deposition, a single-crystal diamond in which a density of crystal defect points, which are tip points of crystal defect lines reaching a crystal growth main surface, is more than 300 mm$^{-2}$. Hence, there is obtained a single-crystal diamond in which occurrence of large chipping is further suppressed due to stress relaxation provided by the high density of the crystal defect lines. Furthermore, in order to further suppress the large chipping of the single-crystal diamond, the density of the seed crystal defect points can be more than 1000 mm$^{-2}$, and can be more than $1\times10^4$ mm$^{-2}$. However, if the density of the seed crystal defect points is too high, the seed crystal defect points are too close to each other, with the result that an effect of increasing stress becomes larger than the stress relaxation. Hence, the density of the seed crystal defect points can be preferably less than $1 \times 10^6$ mm$^{-2}$.

In the method of producing the single-crystal diamond of the present embodiment, in the single-crystal diamond to be grown, a density of combined dislocation points of the crystal defect points can be more than 20 mm$^{-2}$, each of the combined dislocation points being a tip point of a combined dislocation reaching the crystal growth main surface, the combined dislocation resulting from a combination of at least either of a plurality of edge dislocations and a plurality of screw dislocations. Since the density of the combined dislocation points, which are the tip points of the combined dislocations reaching the crystal growth main surface, is more than 20 mm$^{-2}$ and the effect of stress relaxation provided by the combined dislocations is large in such a single-crystal diamond, occurrence of large chipping is suppressed further. In view of this, the density of the combined dislocation points can be preferably more than 30 mm$^{-2}$, and can be more preferably more than 300 cm$^{-2}$.

In the method of producing the single-crystal diamond according to the present embodiment, in a secondary electron image from an electron microscope after hydrogen-terminating the main surface of the diamond seed crystal, a density of seed crystal damage points can be more than 3 mm$^{-2}$, each of the seed crystal damage points representing a point at which a crystal damage exists. In the method of producing the single-crystal diamond, since the density of the seed crystal damage points, which lead particularly to generation of a multiplicity of crystal defect lines of the seed crystal defect points in the single-crystal diamond grown by chemical vapor deposition, is more than 3 mm$^{-2}$, a single-crystal diamond having a high density of crystal defect lines is obtained by chemical vapor deposition, thus obtaining a single-crystal diamond in which large chipping is suppressed due to stress relaxation provided by the high density of the crystal defect lines.

In the method of producing the single-crystal diamond according to the present embodiment, in a secondary electron image from an electron microscope after hydrogen-terminating the main surface of the diamond seed crystal, a density of seed crystal damage points can be more than 30 mm$^{-2}$, each of the seed crystal damage points representing a point at which a crystal damage exists. In the method of producing the single-crystal diamond, since the density of the seed crystal damage points, which lead particularly to generation of a multiplicity of crystal defect lines, of the seed crystal defect points in the single-crystal diamond grown by chemical vapor deposition, is more than 30 mm$^{-2}$, a single-crystal diamond having a high density of crystal defect lines is obtained by chemical vapor deposition, thus obtaining a single-crystal diamond in which large chipping is suppressed due to stress relaxation provided by the high density of the crystal defect lines.

A tool according to still another embodiment of the present invention is a tool selected from a group consisting of a cutting bite, a milling cutter wiper, an end mill, a drill, a reamer, a cutter, a dresser, a wire guide, a wire drawing die, a water jet nozzle, a diamond knife, a glass cutter and a scriber, the tool including the single-crystal diamond of the above-described embodiment at a contact portion with a workpiece. Since such a tool includes the single-crystal diamond of the above-described embodiment at the contact portion with the workpiece, large chipping is suppressed, chipping resistance is high, and strength is high.

The component according to yet another embodiment of the present invention is a component selected from a group consisting of an optical component, a heat sink, a biochip, a sensor, and a semiconductor substrate, the component including the single-crystal diamond of the above-described embodiment. Since such a component includes the single-crystal diamond of the above-described embodiment, large chipping is suppressed, chipping resistance is high, and strength is high.

DETAILS OF EMBODIMENTS OF THE PRESENT INVENTION

First Embodiment: Single-Crystal Diamond

Figure 2:
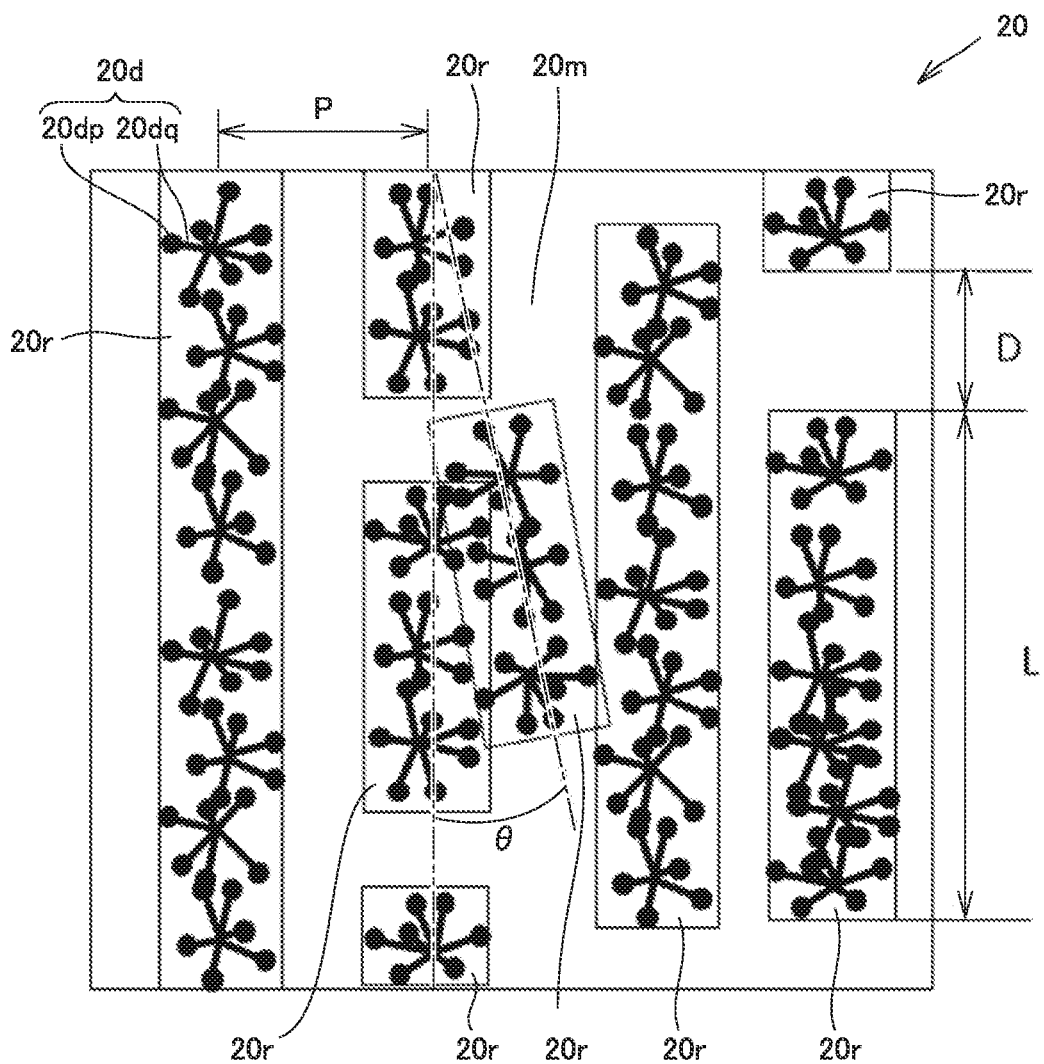
FIG. 2 is a schematic view showing an area larger than that of FIG. 1.
Figure 3:
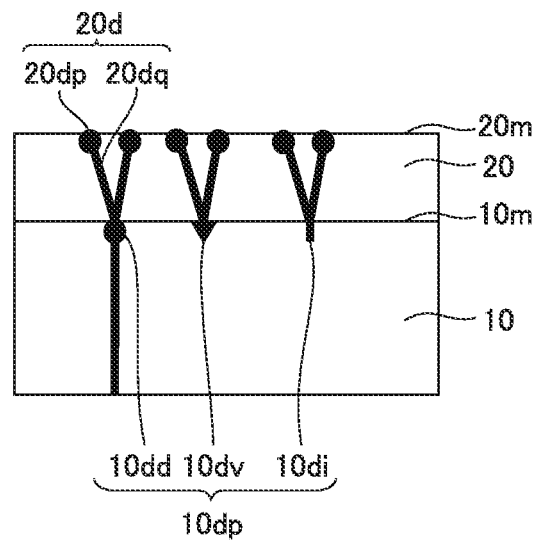
FIG. 3 is a schematic cross sectional view showing an exemplary cross section perpendicular to the crystal growth main surface of the single-crystal diamond according to the embodiment of the present invention.

With reference to FIG. 1, FIG. 2, and FIG. 3, in a single-crystal diamond 20 of the present embodiment, in an X-ray topography image for a crystal growth main surface 20*m* of single-crystal diamond 20, a group of crystal defect points 20*dp* are gathered, each of crystal defect points 20*dp* being a tip point of a crystal defect line 20*dq* reaching crystal growth main surface 20*m*, crystal defect line 20*dq* representing a line in which a crystal defect 20*d* exists. Moreover, in a single-crystal diamond 20 of the present embodiment, in an X-ray topography image for a crystal growth main surface 20*m* of single-crystal diamond 20, a plurality of crystal defect line-like gathered regions 20*r* exist in parallel, and in the plurality of crystal defect line-like gathered regions 20*r*, groups of crystal defect points 20*dp* are gathered to extend in a form of lines in a direction angled by not more than 30° relative to one arbitrarily specified direction, each of crystal defect points 20*dp* being a tip point of a crystal defect line 20*dq* reaching crystal growth main surface 20*m*, crystal defect line 20*dq* representing a line in which a crystal defect 20*d* exists. FIG. 1 schematically shows an X-ray topography image captured in a transmission type, wherein for ease of description, black dots represent crystal defect points 20*dp*, which are the tip points of crystal defect lines 20*dq* reaching crystal growth main surface 20*m*.

A type Ib single-crystal diamond, which is grown by a high-temperature/high-pressure method and is widely used for a cutting tool, a wear-resisting tool, or the like, includes an isolated substitutional nitrogen impurity to prevent large chipping from occurring due to isolated substitutional nitrogen atoms serving as starting points of plastic deformation. However, isolated substitutional nitrogen atoms are less likely to be introduced into a single-crystal diamond grown by CVD (CVD single-crystal diamond) and nitrogen atoms are present therein such that they are clustered with vacancies or a plurality of nitrogen atoms, thus resulting in large chippings adversely.

The present inventors have found a phenomenon of reducing occurrence of large chippings, which would otherwise result in such a CVD single-crystal diamond being unusable as a cutting tool, by relaxing stress to promote minute wear in the following manner: a multiplicity of distributed crystal defects 20*d* are introduced actively into the CVD single-crystal diamond to provide a plurality of crystal defect line-like gathered regions 20*r* which exist in parallel and in which groups of crystal defect points 20*dp* are gathered to extend in the form of lines in a direction angled by not more than 30° relative to one arbitrarily specified direction. Moreover, the present inventors have found that the improved chipping resistance through the introduction of dislocations are inherent to the CVD single-crystal diamond because no improved chipping resistance is observed in a type Ib single-crystal diamond grown by the high-temperature/high-pressure method due to the following reasons: it is difficult to introduce distributed dislocations into such a type Ib single-crystal diamond unlike the CVD single-crystal diamond; and a multiplicity of dislocations are radially spread therein from a seed crystal to more likely result in a bunch of crystal defects with no or low anisotropy.

Single-crystal diamond 20 of the present embodiment is used suitably for a cutting tool, a polishing tool, an optical component, an electronic component, a semiconductor material, and the like because the plurality of crystal defect line-like gathered regions 20r in which the groups of crystal defect points 20dp, each of which is a tip point of crystal defect line 20dq reaching crystal growth main surface 20m, are gathered to extend in the form of lines in the direction angled by not more than 30° relative to the one arbitrarily specified direction exist in parallel, whereby occurrence of large chipping is suppressed by stress relaxation provided by the multiplicity of crystal defect lines 20dq and it is possible to control a direction in which single-crystal diamond 20 is less likely to be chipped by way of the plurality of crystal defect line-like gathered regions 20r existing in parallel and extending in the form of lines in the direction angled by not more than 30° relative to the one arbitrarily specified direction.

Here, the one arbitrarily specified direction refers to a direction of an average of directions in which the groups of crystal defect lines are gathered to extend in the form of lines, and can be selected depending on an application or usage. For example, for a cutting tool, the one arbitrarily specified direction may be a <110> direction in which wear resistance is high. Alternatively, in consideration of productivity in a polishing step, the one arbitrarily specified direction may be a <100> direction in which wear is facilitated. The directions in which the groups of crystal defect lines are gathered to extend in the form of lines may be varied to some extent; however, it has been found that chipping resistance is improved effectively by setting θ in FIG. 2 at not more than 30°.

In single-crystal diamond 20 of the present embodiment, the existence of crystal defect points 20dp and crystal defect lines 20dq is shown in the X-ray topography image for crystal growth main surface 20m. Specifically, since crystal defect points 20dp and crystal defect lines 20dq have higher X-ray reflection intensities than those of portions other than crystal defect points 20dp and crystal defect lines 20dq in the crystal (portions with less defects, i.e., portions with high crystallinity), the existence of crystal defect points 20dp and crystal defect lines 20dq are shown as dark portions in the case of a positive X-ray topography image and are shown as bright portions in the case of a negative X-ray topography image.

Here, crystal defects 20d include various types of defects such as point defects, dislocations, chippings, cracks, and crystal strains. Moreover, the dislocations include edge dislocations, screw dislocations, and combined dislocations resulting from combinations of at lease either of a plurality of edge dislocations and a plurality of screw dislocations. Each of crystal defect lines 20dq constituted of such crystal defects 20d is stopped when crystal defect line 20dq is newly generated or crystal defect line 20dq reaches crystal growth main surface 20m. The tip point of crystal defect line 20dq reaching crystal growth main surface 20m is referred to as "crystal defect point 20dp". In the present invention, the number of crystal defect points 20dp for every unit area is counted to define a density of crystal defect points 20dp. Since it is practically impossible to count not less than $1 \times 10^4$ crystal defect points as in the present invention, an average value of the crystal defect points in five locations within an arbitrary region with a limited range may be taken. The crystal defect points are counted within the region with a limited range such as a region of 1 mm square when there are expected to be not less than $10/\text{mm}^2$ crystal defect points, a region of 500 μm square when there are expected to be not less than $100/\text{mm}^2$ crystal defect points, or a region of 100 μm square when there are expected to be not less than $1 \times 10^4/\text{mm}^2$ crystal defect points. Then, the crystal defect points thus counted are converted into a unit of $\text{mm}^{-2}$. In doing so, the region in which the crystal defect points are counted must be a region including the crystal defect line-like gathered regions. If it is unknown which one of the stopped portions of a crystal defect line reaches the crystal growth main surface, the crystal defect point is specified by changing incident angle and diffracting plane for a transmission type X-ray topography image or by capturing a reflection type X-ray topography image.

Each crystal defect line-like gathered region 20r is formed by crystal defect points 20dp, which are the tip points of crystal defect lines 20dq and which are gathered in the form of lines at crystal growth main surface 20m, each of crystal defect lines 20dq being a line in which crystal defect 20d exists. Accordingly, crystal defect line-like gathered region 20r can be shown suitably in an X-ray topography image measured in the transmission type in a direction parallel to the crystal growth direction of single-crystal diamond 20 (i.e., a direction perpendicular to crystal growth main surface 20m). Although an X-ray topography image can be measured in the reflection type, crystal defect lines 20dq are overlapped in the X-ray topography image measured in the reflection type, with the result that it becomes difficult to discern a state of gathering of crystal defect points 20dp. Although there is also a method (double-refraction method) employing double refraction to measure such crystal defects, some dislocations may not appear in the double-refraction image or point defects that are not structure defects may appear in the double-refraction image. Hence, the X-ray topography is more preferable than the double-refraction method.

In the measurement of the X-ray topography image for the single-crystal diamond of the present embodiment, it is preferable to use X rays, which are synchrotron radiation, because it is necessary to observe the high density of the crystal defect points. For the transmission type, the measurement is performed using X rays with a wavelength of 0.71 Å and (220) diffraction of 2θ=32.9°, for example. On the other hand, for the reflection type, the measurement may be performed using X rays with a wavelength of 0.96 Å and (113) diffraction of 2θ=52.4°, for example. If the crystal defect points are not discerned as described above, the crystal defect points are specified by capturing an image in a different wavelength and at a different angle of diffraction. Similarly, the measurement may be performed using an X-ray diffractometer of a laboratory system. For example, (111) diffraction may be observed using a Mo radiation source or (113) diffraction may be observed using a Cu radiation source; however, a long measurement time is required to capture an image with high resolution. Although a CCD camera can be used for the measurement, it is desirable to use a nuclear plate to increase resolution. It is desirable to perform all of storage, development, and fixing of the nuclear plate in a cool environment of not more than 10° C. in order to avoid increase in noise. After the development, an image is captured with an optical microscope to quantify the crystal defect points and the crystal defect lines.

The crystal growth direction of single-crystal diamond 20 corresponds to the direction of the average of the directions of the plurality of crystal defect lines 20dq. Moreover, crystal growth main surface $20m$ of the single-crystal diamond refers to the outermost main surface in the crystal growth, and is generally a main surface perpendicular to the crystal growth direction.

Regarding the direction in which crystal defect line-like gathered regions $20r$ extends in the form of lines, the one arbitrarily specified direction serving as a reference is preferably a <100> direction, and the direction in which crystal defect line-like gathered regions $20r$ extend in the form of lines is preferably a direction angled by not more than 30° relative to the <100> direction, and is more preferably a direction angled by not more than 15° relative to the <100> direction. By setting the direction in which crystal defect line-like gathered regions $20r$ extend in the form of lines to fall within the above-described range, chipping of single-crystal diamond 20 can be suppressed more since a single-crystal diamond is likely to be cleaved in the <111> direction. Moreover, since a diamond seed crystal used when growing single-crystal diamond 20 through CVD is often a type Ib single crystal grown through the high-temperature/high-pressure method, single-crystal diamond 20 having a main surface parallel to the <100> direction can be readily obtained, thereby readily obtaining a tool with a large edge width or an optical component, electronic component, or semiconductor material with a large area. It should be noted that depending on a type of tool to be used, the one arbitrarily specified direction may be a <110> direction in which wear resistance thereof is high. Hence, in that case, the <110> direction is regarded as the direction in which crystal defect line-like gathered regions $20r$ extend in the form of lines.

In single-crystal diamond 20 of the present embodiment, two or more crystal defect line-like gathered regions $20r$ exist for every 1 mm in a direction perpendicular to the direction in which crystal defect line-like gathered regions $20r$ extend in the form of lines (the direction of the average of the plurality of directions in which the plurality of crystal defect line-like gathered regions extend, i.e., the one direction specified above), and an interval D therebetween is preferably not more than 500 μm in the direction in which crystal defect line-like gathered regions $20r$ extend in the form of lines. Since two or more crystal defect line-like gathered regions $20r$ exist for every 1 mm in the direction perpendicular to the direction in which crystal defect line-like gathered regions $20r$ extend in the form of lines and the interval therebetween is not more than 500 μm in the direction in which crystal defect line-like gathered regions $20r$ extend in the form of lines in such a single-crystal diamond 20, occurrence of large chipping is suppressed by stress relaxation provided by the multiplicity of crystal defect lines $20dq$ and it is possible to control a direction in which the single-crystal diamond 20 is less likely to be chipped by way of the high density of crystal defect line-like gathered regions $20r$ existing in parallel and extending in the form of lines in the direction angled by not more than 30° relative to the one arbitrarily specified direction.

In view of the above, it is more preferable that four crystal defect line-like gathered regions $20r$ exist for every 1 mm in the direction perpendicular to the direction in which crystal defect line-like gathered regions $20r$ extend in the form of lines, and/or that interval D is not more than 100 μm in the direction in which crystal defect line-like gathered regions $20r$ extend in the form of lines. A pitch P between the plurality of crystal defect line-like gathered regions $20r$ existing in parallel is preferably not more than 500 μm, more preferably, not more than 250 μm.

In single-crystal diamond 20 of the present embodiment, crystal defect line-like gathered regions $20r$ preferably include, for every 1 cm$^2$ at crystal growth main surface $20m$, five or more crystal defect line-like gathered regions each having a long length L of not less than 300 μm as shown in FIG. 2. Since single-crystal diamond 20 includes, for every 1 cm$^2$ at crystal growth main surface $20m$, the five or more crystal defect line-like gathered regions each having a long length of not less than 300 μm, occurrence of chipping in single-crystal diamond 20 is suppressed and strength of the whole of single-crystal diamond 20 is increased. In view of this, crystal defect line-like gathered regions $20r$ more preferably include, for every 1 cm$^2$ at the main surface, 20 or more crystal defect line-like gathered regions each having a longer length L of not less than 500 μm as shown in FIG. 2. It is assumed that at least a region of 1 mm square (1 mm×1 mm) is observed when quantifying: the number of crystal defect line-like gathered regions for every 1 mm (the number·mm'); the interval therebetween in the direction in which the crystal defect line-like gathered regions extend in the form of lines (μm); the number of the long crystal defect line-like gathered regions each having a length of not less than 300 μm (the number·cm$^{-2}$); and the number of the longer crystal defect line-like gathered regions each having a length of not less than 500 μm (the number·cm$^{-2}$).

In single-crystal diamond 20 of the present embodiment, the density of crystal defect points $20dp$ is preferably more than 20 mm$^{-2}$, is more preferably more than 300 mm$^{-2}$, is further preferably more than 1000 mm$^{-2}$, and is particularly preferably more than $1 \times 10^4$ mm$^{-2}$. Since the density of crystal defect points $20dp$ is more than 20 mm$^{-2}$ in such a single-crystal diamond 20, occurrence of large chipping is suppressed due to stress relaxation provided by the high density of crystal defect lines $20dq$ corresponding to the high density of crystal defect points $20dp$. Further, when the density of crystal defect points $20dp$ is more than 1000 mm$^{-2}$, chipping resistance is excellent even in intermittent cutting with a wiper chip or the like. However, if crystal defect points $20dp$ are too close to one another, an effect of increasing stress is applied adversely. Hence, the density of crystal defect points $20dp$ is preferably less than $1 \times 10^6$ mm$^2$.

In single-crystal diamond 20 of the present embodiment, the density of the combined dislocation points of crystal defect points $20dp$ is preferably more than 20 mm$^{-2}$, is more preferably more than 30 mm$^{-2}$, is further preferably more than 300 mm$^{-2}$, and is particularly preferably more than 3000 mm$^{-2}$. Each of the combined dislocation points is a tip point of a combined dislocation reaching crystal growth main surface $20m$, the combined dislocation resulting from a combination of at least either of a plurality of edge dislocations and a plurality of screw dislocations. Since the density of the combined dislocation points, which are the tip points of the combined dislocations reaching crystal growth main surface $20m$, is more than 20 mm$^{-2}$ and the effect of stress relaxation provided by the combined dislocations is large in such a single-crystal diamond 20, occurrence of large chipping is suppressed further. Furthermore, when the density of the combined dislocation points is more than 300 mm$^{-2}$, chipping resistance is also excellent even in intermittent cutting with a wiper chip or the like. However, if the combined dislocation points are too close to one another, an effect of increasing stress is applied adversely. Hence, the density of combined dislocation points is preferably less than $3 \times 10^5$ mm$^{-2}$.

Here, the combined dislocations can be observed by changing an X-ray diffraction direction (g vector) in the X-ray topography. For example, when observing, in the transmission type, the (001) plane that is crystal growth main surface 20m of the diamond single crystal, the edge dislocations can be observed in a g vector of a [440] direction and cannot be observed in a g vector of a [4-40] direction or the like orthogonal to the foregoing g vector, whereas the combined dislocations can be observed in a plurality of g vectors of the [440] direction, the [4-40] direction, and the like orthogonal to one another. It should be noted that when observing other dislocations having a Burgers vector that is not perpendicular to the <001> direction, in which the dislocations, i.e., crystal defect lines 20*dq* extend and that has a component also in the <001> direction, such dislocations can be observed in the reflection type in g vectors of the [044] direction, the [004] direction, the [111] direction, the [113] direction, and the like, for example. However, in the case of the reflection type, crystal defect lines 20*dq* such as the dislocations are overlapped with one another in the image, with the result that it becomes difficult to discern whether or not the crystal defects are in the form of the structure of the present invention.

Figure 4:
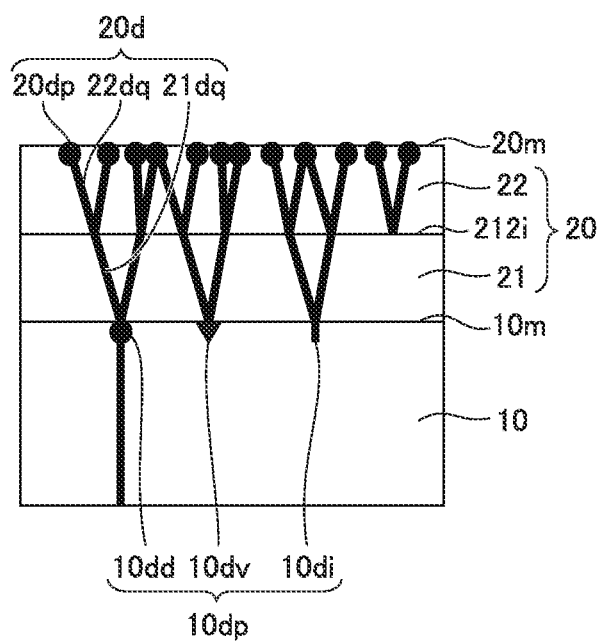
FIG. 4 is a schematic cross sectional view showing another exemplary cross section perpendicular to the crystal growth main surface of the single-crystal diamond according to the embodiment of the present invention.

With reference to FIG. 4, single-crystal diamond 20 of the present embodiment preferably include a plurality of single-crystal diamond layers 21, 22. Since single-crystal diamond 20 includes the plurality of single-crystal diamond layers 21, 22, formation of crystal defect lines 21*dq*, 22*dq* is facilitated, thus further suppressing occurrence of large chipping.

First single-crystal diamond layer 21 is grown by CVD on a main surface 10m of a diamond seed crystal 10 having seed crystal defect line-like gathered regions in which groups of seed crystal defect points 10*dp* are gathered to extend in the form of lines at main surface 10m, and crystal defect lines 21*dq* transferred from the defects of seed crystal defect points 10*dp* at main surface 10m extend in first single-crystal diamond layer 21 in the crystal growth direction. In second single-crystal diamond layer 22 grown by CVD on first single-crystal diamond layer 21, crystal defect points 20*dp* are represented by tip points of crystal defect lines 22*dq* that extend in the crystal growth direction, that reach crystal growth main surface 20m of single-crystal diamond 20, and that have defects transferred from crystal defect lines 21*dq*.

On this occasion, generally, in first single-crystal diamond layer 21, a plurality of crystal defect lines 21*dq* are transferred from one seed crystal defect point 10*dp* of diamond seed crystal 10, and in second single-crystal diamond layer 22, a plurality of crystal defect lines 22*dq* are transferred from one crystal defect line 21*dq* of first single-crystal diamond layer 21. Hence, as the number of single-crystal diamond layers 21, 22 is increased, the number of crystal defect points 20*dp* of single-crystal diamond 20 is increased.

Figure 5:
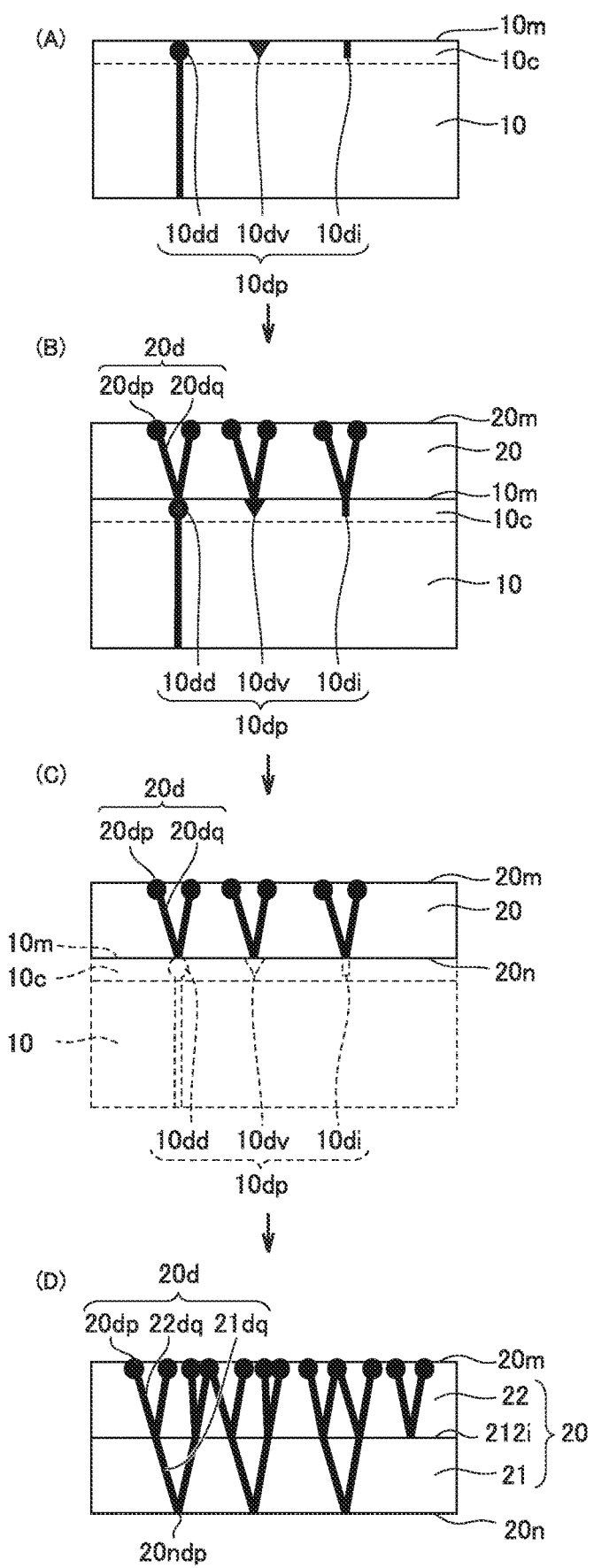
FIG. 5 is a schematic cross sectional view showing a method of producing a single-crystal diamond according to another embodiment of the present invention.

FIG. 5 (C) shows single-crystal diamond 20 which is grown on main surface 10m of diamond seed crystal 10 as shown in FIG. 3 and from which diamond seed crystal 10 is removed. Moreover, FIG. 5 (D) shows single-crystal diamond 20 which includes the plurality of single-crystal diamond layers 21, 22 grown on main surface 10m of diamond seed crystal 10 as shown in FIG. 4 and from which diamond seed crystal 10 is removed.

With reference to FIG. 5 (D), single-crystal diamond 20 of the present embodiment includes the plurality of single-crystal diamond layers 21, 22, wherein crystal defect lines 21*dq*, 22*dq* are newly generated or branched at an interface 212*i* between single-crystal diamond layers 21, 22, and the density of crystal defect points 20*dp* of crystal growth main surface 20m is higher than the density of crystal defect points 20*ndp* of main surface 20n opposite to crystal growth main surface 20m. Since crystal defect lines 21*dp*, 22*dp* are newly generated or branched at the interface between single-crystal diamond layers 21, 22 in such a single-crystal diamond 20, crystal defect points 20*dp* of crystal growth main surface 20m are increased as the number of single-crystal diamond layers 21, 22 is increased, with the result that the density of crystal defect points 20*dp* of crystal growth main surface 20m becomes higher than the density of crystal defect points 20*ndp* of main surface 20n opposite to crystal growth main surface 20m, thus further increasing chipping resistance. It should be noted that as shown in FIG. 5 (D), the newly generated crystal defect lines may be branched and extended.

Figure 6:
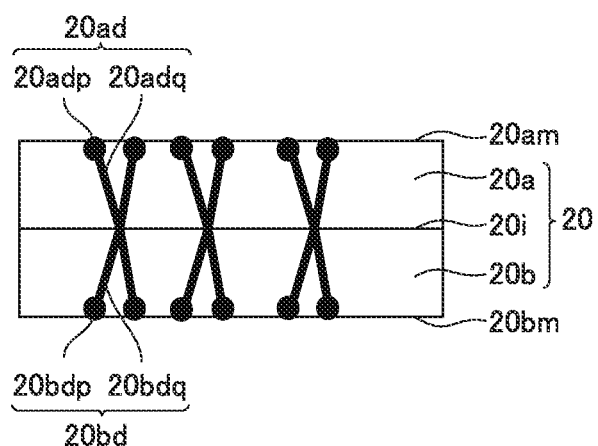
FIG. 6 is a schematic cross sectional view showing still another exemplary cross section perpendicular to the crystal growth main surface of the single-crystal diamond according to the embodiment of the present invention.

FIG. 6 shows a single-crystal diamond obtained by growing another single-crystal diamond on main surface 20n opposite to crystal growth main surface 20m of single-crystal diamond 20 shown in FIG. 5 (C). Moreover, FIG. 7 shows a single-crystal diamond obtained by growing another single-crystal diamond including a plurality of single-crystal diamond layers on main surface 20n opposite to crystal growth main surface 20m of single-crystal diamond 20 including the plurality of single-crystal diamond layers 21, 22 shown in FIG. 5 (D).

Figure 7:
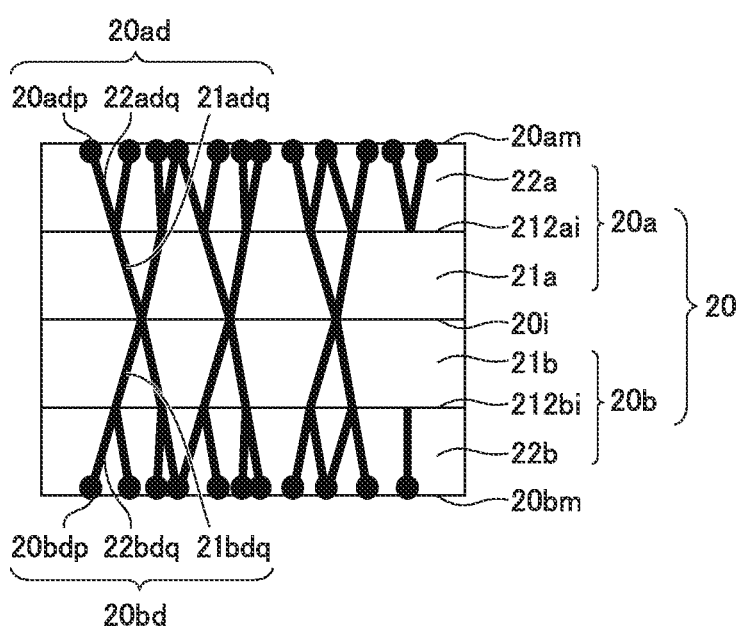
FIG. 7 is a schematic cross sectional view showing yet another exemplary cross section perpendicular to the crystal growth main surface of the single-crystal diamond according to the embodiment of the present invention.

With reference to FIG. 6 and FIG. 7, single-crystal diamond 20 of the present embodiment includes a plurality of single-crystal diamond layers 20a, 20b, 21a, 21b, 22a, 22b, wherein crystal defect lines 20*adq*, 20*bdq*, 21*adq*, 21*bdq*, 22*adq*, 22*bdq* are newly generated, disappeared, branched or merged at interfaces 20i, 212*ai*, 212*bi* between single-crystal diamond layers 20a, 20b, 21a, 21b, 22a, 22b, and the densities of crystal defect points 20*adp* of crystal growth main surface 20*am* and crystal defect points 20*bdp* of crystal growth main surface 20*bm* opposite to crystal growth main surface 20*am* are higher than the densities of the crystal defect points at interfaces 20i, 212*ai*, 212*bi* between single-crystal diamond layers 20a, 20b, 21a, 21b, 22a, 22b. Since crystal defect lines 20*adq*, 20*bdq*, 21*adq*, 21*bdq*, 22*adq*, 22*bdq* are newly generated, disappeared, branched or merged at interfaces 20i, 212*ai*, 212*bi* between single-crystal diamond layers 20a, 20b, 21a, 21b, 22a, 22b in such a single-crystal diamond 20, the number of crystal defect points 20*adp* of crystal growth main surface 20*am* and the number of crystal defect points 20*bdp* of crystal growth main surface 20*bm* opposite thereto are increased as the number of single-crystal diamond layers 20a, 20b, 21a, 21b, 22a, 22b is increased, with the result that the densities of crystal defect points 20*adp* of crystal growth main surface 20*am* and crystal defect points 20*bdp* of crystal growth main surface 20*bm* opposite thereto become higher than the densities of the crystal defect points at interfaces 20i, 212*ai*, 212*bi* between single-crystal diamond layers 20a, 20b, 21a, 21b, 22a, 22b. In this way, occurrence of large chippings is suppressed at both the main surfaces and high chipping resistances and high strengths of both the main surfaces are provided. It should be noted that the disappearance of crystal defect lines means disappearance of some of the plurality of crystal defect lines.

As described below, single-crystal diamonds 20 shown in FIG. 6 and FIG. 7 are obtained by growing single-crystal diamond layers 20a, 20b into crystal growth main surfaces 20*am*, 20*bm* from interface 20i therebetween. Hence, crystal defect lines 20*adq*, 20*bdq* are newly generated or branched in the respective directions from interface 20i to crystal growth main surfaces 20*am*, 20*bm*. That is, in the direction from one crystal growth main surface 20*am* to the other crystal growth main surface 20*bm* via interface 20i, crystal defect lines 20*adq*, 21*adq*, 22*adq* are disappeared or merged in a region from one crystal growth main surface 20*am* to interface 20i and crystal defect lines 20*bdq*, 21*bdq*, 22*bdq* are newly generated or branched in a region from interface 20i to the other crystal growth main surface 20bm.

When the crystal defect lines are newly generated, disappeared, branched or merged at the interfaces between the single-crystal diamond layers as described above, it is difficult to discern positions of the crystal defect lines and crystal defect points. To discern such a structure, it is preferable to cut the single-crystal diamond and perform measurement at the cross section thereof. The structure is readily discerned for the measurement when the cutting direction is the <100> direction and the cross section corresponds to the (010) plane; however, other directions may be employed such as a cross section corresponding to the (110) plane.

Here, in single-crystal diamond 20 shown in each of FIG. 5 (C) and FIG. 5 (D), the density of crystal defect points 20dp of crystal growth main surface 20m becomes high to result in high chipping resistance at the crystal growth main surface 20m side, but chipping resistance at the main surface 20n side opposite to crystal growth main surface 20m does not become high. On the other hand, in each of single-crystal diamonds 20 shown in FIG. 6 and FIG. 7, the densities of crystal defect points 20adp of crystal growth main surface 20am and crystal defect points 20bdp of crystal growth main surface 20bm opposite thereto become high to result in high chipping resistances at both the main surface sides. Moreover, the single-crystal diamond including the plurality of single-crystal diamond layers 21, 21a, 21b, 22, 22a, 22b including (i) a layer having a smaller number of crystal defect lines 21dq, 21adq, 21bdq, 22dq, 22adq, 22bdq and (ii) a layer having a larger number of crystal defect lines 21dq, 21adq, 21bdq, 22dq, 22adq, 22bdq has a higher chipping resistance than that of a single-crystal diamond in which crystal defect lines are uniformly distributed in the thickness direction and which has the same crystal defect density as the foregoing single-crystal diamond. Thus, the single-crystal diamond having an uneven distribution of crystal defect lines in the thickness direction can be a material with which both a rake face and a brazing face are strong and are less likely to be chipped and brazing is less likely to be detached in the case of a cutting bite, for example.

Single-crystal diamond 20 of the present embodiment preferably contains not less than 1 ppm of nitrogen atoms as impurity atoms. This single-crystal diamond 20 contains not less than 1 ppm of nitrogen atoms as impurity atoms, and the nitrogen atoms are clustered nitrogen atoms providing starting points of chipping or cracking, rather than isolated substitutional nitrogen atoms providing no starting points of chipping or cracking; however, occurrence of large chipping is suppressed due to stress relaxation provided by the multiplicity of crystal defect lines. The clustered nitrogen atoms refer to nitrogen atoms adjacent to a plurality of nitrogen atoms and/or vacancies in the diamond single crystal, such as A Center, B Center, N3 Center, H3 Center, or NV Center. In the single-crystal diamond obtained by CVD, it is difficult to introduce isolated substitutional nitrogen atoms into the single crystal; however, even though the clustered nitrogen atoms are introduced, chipping resistance becomes high by introducing a multiplicity of crystal defect lines. In view of the above, not less than 3 ppm of nitrogen atoms are more preferably contained in single-crystal diamond 20 as impurity atoms, not less than 10 ppm of nitrogen atoms are further preferably contained therein, and not less than 30 ppm of nitrogen atoms are particularly preferably contained therein. Further, when the concentration of the nitrogen atoms is not less than 10 ppm, excellent chipping resistance is exhibited also for intermittent cutting. However, if the concentration of the nitrogen atoms is too high while the density of the crystal defect lines is high, stress is not relaxed before occurrence of chipping. Hence, the concentration of the nitrogen atoms is preferably not more than 1000 ppm.

Single-crystal diamond 20 of the present embodiment preferably contains less than 1 ppm of nitrogen atoms as impurity atoms. Since such a single-crystal diamond 20 contains only less than 1 ppm of nitrogen atoms as impurity atoms, the concentration of the nitrogen atoms, which are heteroelement atoms disrupting expansion of chipping when a strong stress is applied to a particular portion, is low. Hence, large chipping in a long distance is more likely to occur; however, the expansion of chipping is disrupted by the multiplicity of crystal defect lines 20dq and stress relaxation provided by the multiplicity of crystal defect lines 20dq, thereby suppressing occurrence of large chipping. In view of the above, not more than 0.3 ppm of nitrogen atoms are more preferably contained in single-crystal diamond 20 as impurity atoms, not more than 0.1 ppm of nitrogen atoms are further preferably contained therein, and not more than 0.03 ppm of nitrogen atoms are particularly preferably contained therein. Furthermore, when the concentration of the nitrogen atoms is not more than 0.1 ppm, excellent cracking resistance is attained in an application exposed to repeated thermal shock, such as a laser window material. However, if there is no nitrogen atom at all, chipping of the single-crystal diamond cannot be suppressed, so that not less than 0.01 ppb of nitrogen atoms is preferable. The nitrogen concentration is measured by secondary ion mass spectrometry (SIMS), electron spin resonance analysis (ESR), or the like, for example. In doing so, an amount of isolated substitutional nitrogen measured by ESR is not more than 50%, preferably not more than 10%, further preferably not more than 1%, of a total amount of nitrogen measured by SIMS.

In order to suppress large chipping, in single-crystal diamond 20 of the present embodiment, a transmittance for 400-nm light when the thickness of single-crystal diamond 20 is 500 μm is preferably not more than 60%, more preferably not more than 30%, and further preferably not more than 10%, and particularly preferably not more than 5%. Here, the "transmittance for light when the thickness of the single-crystal diamond is 500 μm" refers to a transmittance for light measured when the thickness thereof is 500 μm, or a transmittance of light obtained by measuring a transmittance of light when the thickness thereof is not 500 μm and converting the measured transmittance into a transmittance when the thickness is 500 μm. For precise evaluation of the transmittance for light, it is preferable to polish a surface to attain a surface scattering of not more than 2%. A single-crystal diamond with a small transmittance for light of not more than 400 nm includes a multiplicity of crystal defect lines and/or nitrogen atoms, thereby suppressing crack and providing high chipping resistance. Here, the "transmittance for light" refers to a substantial transmittance for incoming light, rather than a transmittance therein excluding reflectance. Hence, even when there is no absorption or scattering, the transmittance will be about 71% at maximum. A converted value of transmittance in the case of a different thickness can be obtained using a generally known formula in consideration of multiple reflections therein.

In order to obtain an increased effect of improving chipping resistance, the main surface of single-crystal diamond 20 of the present embodiment preferably has a diameter of not less than 3 mm, more preferably has a diameter of not less than 6 mm, and further preferably has a diameter of not less than 10 mm. It should be noted that a single-crystal diamond having a main surface with a diameter of not less than 10 mm and having no crystal defect line-like gathered regions of the present embodiment is readily chipped during cutting with a bite.

Second Embodiment: Method of Producing Single-Crystal Diamond

With reference to FIG. 5, a method of producing single-crystal diamond 20 of the present embodiment includes: a step (FIG. 5 (A)) of preparing diamond seed crystal 10 having seed crystal defect line-like gathered regions in which groups of seed crystal defect points 10dp are gathered to extend in the form of lines at main surface 10m; and a step (FIG. 5 (B)) of growing single-crystal diamond 20 by chemical vapor deposition on main surface 10m of diamond seed crystal 10.

According to the method of producing single-crystal diamond 20 of the present embodiment, single-crystal diamond 20 is grown by chemical vapor deposition on main surface 10m of diamond seed crystal 10 having the seed crystal defect line-like gathered regions in which the groups of seed crystal defect points 10dp are gathered to extend in the form of lines at main surface 10m, thereby obtaining single-crystal diamond 20 having a plurality of crystal defect line-like gathered regions 20r which exist in parallel and in which the groups of crystal defect points 20dp that are tip points of crystal defect lines 20dq reaching crystal growth main surface 20m are gathered to extend in the form of lines in a direction of not less than 30° relative to the one arbitrarily specified direction. In such a single-crystal diamond 20, occurrence of large chipping is suppressed by stress relaxation provided by the multiplicity of crystal defect lines 20dq and it is possible to control a direction in which the single-crystal diamond 20 is less likely to be chipped by way of the plurality of crystal defect line-like gathered regions 20r existing in parallel and extending in the form of lines in the direction angled by not more than 30° relative to the one arbitrarily specified direction. Hence, single-crystal diamond 20 is used suitably for a cutting tool, a polishing tool, an optical component, an electronic component, a semiconductor material, and the like.

In the method of producing single-crystal diamond 20 of the present embodiment, it is preferable that two or more seed crystal defect line-like gathered regions exist for every 1 mm in the direction perpendicular to the direction in which the seed crystal defect line-like gathered regions extend in the form of lines, and the interval therebetween is not more than 500 μm in the direction in which the seed crystal defect line-like gathered regions extend in the form of lines. According to the method of producing single-crystal diamond 20, two or more seed crystal defect line-like gathered regions exist for every 1 mm in the direction perpendicular to the direction in which the seed crystal defect line-like gathered regions extend in the form of lines, and the interval therebetween is not more than 500 μm in the direction in which the seed crystal defect line-like gathered regions extend in the form of lines, thereby obtaining single-crystal diamond 20 in which two or more crystal defect line-like gathered regions 20r shown in FIG. 1 and FIG. 2 exist for every 1 mm in the direction perpendicular to the direction in which crystal defect line-like gathered regions 20r extend in the form of lines and the interval therebetween is not more than 500 μm in the direction in which crystal defect line-like gathered regions 20r extend in the form of lines. Hence, single-crystal diamond 20 is obtained in which occurrence of large chipping is suppressed by stress relaxation provided by the multiplicity of crystal defect lines 20dq and it is possible to control a direction in which the single-crystal diamond 20 is less likely to be chipped by way of the high density of crystal defect line-like gathered regions 20r existing in parallel and extending in the form of lines in the direction angled by not more than 30° relative to the one arbitrarily specified direction.

In view of the above, it is more preferable that four or more seed crystal defect line-like gathered regions exist for every 1 mm in the direction perpendicular to the direction in which the seed crystal defect line-like gathered regions extend in the form of lines, and/or the interval therebetween is not more than 100 μm in the direction in which the seed crystal defect line-like gathered regions extend in the form of lines. A pitch between the plurality of seed crystal defect line-like gathered regions existing in parallel is preferably not more than 500 μm, more preferably, not more than 250 μm.

In the method of producing single-crystal diamond 20 of the present embodiment, the seed crystal defect line-like gathered regions preferably include, for every 1 $cm^2$ at the main surface, five or more seed crystal defect line-like gathered regions each having a long length of not less than 300 μm. In the method of producing such a single-crystal diamond 20, since the five or more seed crystal defect line-like gathered regions each having a long length of not less than 300 μm are included for every 1 $cm^2$ at the main surface, occurrence of chipping in single-crystal diamond 20 to be grown is suppressed and strength of the whole of single-crystal diamond 20 is improved. In view of this, the seed crystal defect line-like gathered regions more preferably include, for every 1 $cm^2$ in the main surface, 20 or more seed crystal defect line-like gathered regions each having a longer length of not less than 500 μm.

In the method of producing single-crystal diamond 20 of the present embodiment, the density of seed crystal defect points 10dp is preferably more than 10 $mm^{-2}$. In the method of producing such a single-crystal diamond 20, the density of seed crystal defect points 10dp is more than 10 $mm^{-2}$, thereby obtaining, by chemical vapor deposition, a single-crystal diamond in which the density of crystal defect points 20dp, which are the tip points of crystal defect lines 20dq reaching crystal growth main surface 20m, is more than 20 $mm^{-2}$. Hence, there is obtained single-crystal diamond 20 in which occurrence of large chipping is suppressed due to stress relaxation provided by the high density of crystal defect lines 20dq. In view of this, the density of seed crystal defect points 10dp is more preferably more than 100 $mm^{-2}$, is further preferably more than 1000 $mm^{-2}$, and is particularly preferably more than $1\times10^4$ $mm^{-2}$. For example, when the density of seed crystal defect points 10dp is more than 100 $mm^{-2}$, there is obtained, by chemical vapor deposition, a single-crystal diamond in which the density of crystal defect points 20dp, which are the tip points of crystal defect lines 20dq reaching crystal growth main surface 20m, is more than 300 $mm^{-2}$.

In the method of producing single-crystal diamond 20 of the present embodiment, seed crystal defect points 10dp and the seed crystal defect line-like gathered regions are shown suitably in an X-ray topography image measured in the transmission type in the direction perpendicular to main surface 10m of diamond seed crystal 10 (i.e., X-ray topography image for main surface 10m of diamond seed crystal 10).

Figure 8:
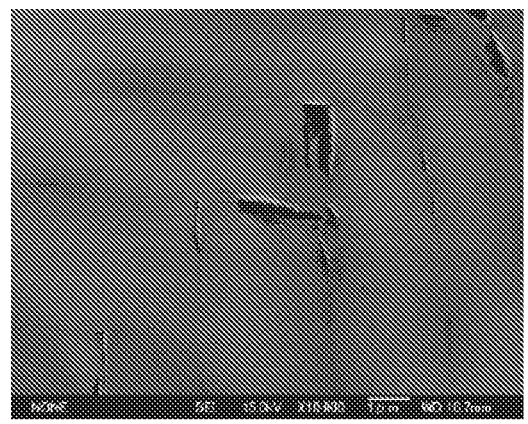
FIG. 8 shows a photograph showing an exemplary secondary electron image from an electron microscope to illustrate a state of a main surface of a diamond seed crystal.
Figure 9:
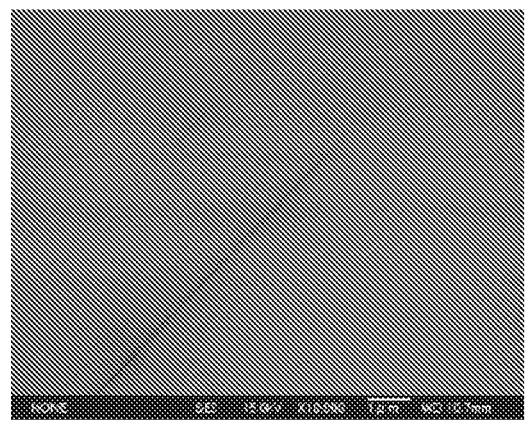
FIG. 9 shows a photograph showing another exemplary secondary electron image from an electron microscope to illustrate a state of a main surface of a diamond seed crystal.

With reference to FIG. 5, FIG. 8, and FIG. 9, in the method of producing single-crystal diamond 20 of the present embodiment, the density of seed crystal damage points is preferably more than 3 mm$^{-2}$. The seed crystal damage points represent points at which crystal damages exist in a secondary electron image for hydrogen-terminated main surface 10m of diamond seed crystal 10 as obtained through an electron microscope. In the method of producing such a single-crystal diamond 20, since the density of the seed crystal damage points, which lead particularly to generation of the multiplicity of crystal defect lines 20dq in single-crystal diamond 20 grown by chemical vapor deposition, among the seed crystal defect points is more than 3 mm$^{-2}$, single-crystal diamond 20 having a high density of crystal defect lines 20dq is obtained by chemical vapor deposition, thus obtaining a single-crystal diamond in which large chipping is suppressed due to stress relaxation provided by the high density of crystal defect lines 20dq. In view of this, it is more preferable that the density of the seed crystal damage points, at which the crystal damages exist in the secondary electron image for hydrogen-terminated main surface 10m of diamond seed crystal 10 as obtained through the electron microscope, is more than 30 mm$^{-2}$.

Here, a method of hydrogen-terminating main surface 10m of diamond seed crystal 10 is not particularly limited; however, in view of efficiency in process, main surface 10m of diamond seed crystal 10 is hydrogen-terminated by (i) introducing a microwave of 2.400 GHz to 2.497 GHz or 902 MHz to 928 MHz under an atmosphere with decreased pressure in which hydrogen gas flows, or (ii) irradiating main surface 10m of diamond seed crystal 10 with hydrogen plasma generated by heating with a hot filament. The temperature of diamond seed crystal 10 on this occasion is preferably not more than 800° C. and more preferably not more than 600° C. in order to prevent a change in shape of main surface 10m of diamond seed crystal 10. Moreover, the temperature of diamond seed crystal 10 on this occasion is preferably not less than 400° C. in order to promote the hydrogen termination process. The hydrogen termination process is preferably performed for not less than 3 minutes in order to perform the hydrogen termination process securely, and is preferably performed for not more than 15 minutes to avoid etching.

Since the hydrogen-terminated main surface 10m of diamond seed crystal 10 has a negative electronegativity, carriers excited by primary electrons of an electron microscope can be readily detected as secondary electrons. Hence, a secondary electron image can be observed as a distribution of defects that traps the carriers in the crystal. Therefore, the crystal damages including the above-described crystal defects, minute cracks, minute strains, and the like as well as the density of the crystal damages can be evaluated not only when main surface 10m shown in FIG. 8 has clear defects such as cracks but also when main surface 10m shown in FIG. 9 has no clear defects. Specifically, regarding the crystal damages, in FIG. 8 and FIG. 9, the minute cracks are observed as dark portions and the minute strains are observed as changes in brightness and darkness. In doing so, in order to increase sensitivity for the seed crystal damage points in the surface of the diamond seed crystal, acceleration voltage for primary electrons is desirably not more than 15 kV.

In the method of producing the single-crystal diamond of the present embodiment, in order to grow a single-crystal diamond having a large diameter, the main surface of the diamond seed crystal preferably has a diameter of not less than 3 mm, more preferably has a diameter of not less than 6 mm, and further preferably has a diameter of not less than 10 mm.

(Step of Preparing Diamond Seed Crystal Having Seed Crystal Defect Line-Like Gathered Regions)

With reference to FIG. 5 (A), the step of preparing diamond seed crystal 10 having the seed crystal defect line-like gathered regions in which the groups of seed crystal defect points 10dp are gathered in the form of lines to extend in the form of lines at main surface 10m is not particularly limited. However, in order to efficiently prepare diamond seed crystal 10 having the seed crystal defect line-like gathered regions in which the groups of seed crystal defect points 10dp are gathered to extend in the form of lines at main surface 10m, the step may include: a sub step of preparing diamond seed crystal 10; a sub step of forming the seed crystal defect line-like gathered regions in which the groups of seed crystal defect points 10dp are gathered to extend in the form of lines at main surface 10m of diamond seed crystal 10; a sub step of checking the densities of seed crystal defect points 10dp and seed crystal damage points 10di at main surface 10m of diamond seed crystal 10; and a sub step of forming a conductive layer region 10c by implanting ions into the main surface 10m side of diamond seed crystal 10.

In the sub step of preparing diamond seed crystal 10, as diamond seed crystal 10, there is prepared a type Ib single-crystal diamond or type IIa single-crystal diamond grown by the high-temperature/high-pressure method, or a single crystal diamond grown by CVD using the type Ib single-crystal diamond or the type IIa single-crystal diamond as a seed crystal.

In the sub step of forming the seed crystal defect line-like gathered regions in which the groups of seed crystal defect points 10dp are gathered to extend in the form of lines at main surface 10m of diamond seed crystal 10, various types of defect points are included in seed crystal defect points 10dp, such as seed crystal point defect points, seed crystal dislocation points 10dd (tip points of dislocations reaching main surface 10m, such as edge dislocations, screw dislocations, and combined dislocations resulting from combinations of at least either of a plurality of edge dislocations and a plurality of screw dislocations), seed crystal chipping points 10dv, seed crystal cracking points, and seed crystal damage points 10di. Moreover, a method of forming the seed crystal defect line-like gathered regions is not particularly limited; however, the seed crystal defect line-like gathered regions may be formed by forming a mask in the form of lines using photolithography and then plasma-etching a portion on which the mask is not formed, for example. Alternatively, the seed crystal defect line-like gathered regions may be formed by laser processing. The seed crystal defect line-like gathered regions may be formed by mechanical polishing using a grindstone obtained by bonding diamond abrasive grains with a metal or a grindstone obtained by dispersing diamond abrasive grains in a cast iron. Further, by performing reactive ion etching (ME), microwave plasma etching, or ion milling after this mechanical polishing, cracks, which serve as starting points of dislocations, can be controlled more precisely. Particularly, if mask formation and ME are performed, it is preferable to perform dry etching using oxygen ($O_2$) and carbon tetrafluoride ($CF_4$) supplied at not more than 1% of flow rate (sccm) relative to the flow rate (sccm) of $O_2$. This is because needlelike irregularities are formed readily after the dry etching and the needlelike irregularities are more likely to serve as starting points of the crystal defect lines after CVD growth.

In order to grow single-crystal diamond 20 having crystal defect line-like gathered regions 20r extending in a preferable direction in the form of lines, the direction in which the seed crystal defect line-like gathered regions extend in the form of lines is preferably a direction angled by not more than 30° relative to the <100> direction and is more preferably a direction angled by not more than 15° relative to the <100> direction.

Here, a "crack" refers to a hole having a depth of not less than 1 μm and a line-like crack having a length of 1 μm to 10 μm. The latter particularly refers to a minute cleavage, which is more likely to be introduced mainly in the <110> direction. A crack point refers to a tip point of the crack reaching main surface 10m. Moreover, a crystal damage refers to a minute hole having a depth of less than 1 μm, a minute crack of less than 1 μm, a crystal strain, and the like. A crystal damage point refers to a tip point of the crystal damage reaching main surface 10m. An arithmetic mean roughness Ra of main surface 10m after the seed crystal processing (arithmetic mean roughness Ra defined in JIS B0601: 2013; the same applies to the description below) is desirably 0.1 nm to 30 nm. Moreover, in this case, main surface 10m preferably has an off angle of not less than 2° and not more than 15° relative to the (001) plane. The off direction of main surface 10m is preferably not more than 15° relative to the <100> direction or not more than 15° relative to the <110> direction. When the off angle of main surface 10m relative to the (001) plane is less than 2°, the off direction is not particularly limited, and it is preferable to perform CVD growth under a pressure higher than the pressure in the case where the off angle of main surface 10m relative to the (001) plane is not less than 2° and not more than 15°.

With the above method, it is preferable that two seed crystal defect line-like gathered regions is formed for every 1 mm at main surface 10m of diamond seed crystal 10 in the direction perpendicular to the direction in which the seed crystal defect line-like gathered regions extend, and that the interval therebetween is not more than 500 μm in the direction in which the seed crystal defect line-like gathered regions extend in the form of lines.

In the sub step of checking the densities of seed crystal defect points 10dp and seed crystal damage points 10di, it is preferable to check whether seed crystal defect points 10dp are more than 10 $mm^{-2}$ by observing an image from optical microscope and/or X-ray topography. Moreover, it is preferable to check whether the density of seed crystal damage points 10di is more than 3 $mm^{-2}$ by observing a secondary electron image of main surface 10m from an electron microscope after hydrogen-terminating main surface 10m of diamond seed crystal 10 as described above. Here, when the density of seed crystal defect points 10dp is not more than 10 $mm^{-2}$ and/or the density of seed crystal damage points 10di is not more than 3 $mm^{-2}$, it is preferable to repeat the sub step of forming the seed crystal defect line-like gathered regions under a different condition. Moreover, when the density of seed crystal defect points 10dp is more than $1 \times 10^6$ $mm^{-2}$ and/or the density of seed crystal damage point 10di is more than $5 \times 10^5$ $mm^{-2}$, it is preferable to decrease the density of at least either of the seed crystal defect points and the seed crystal damage points through etching or the like.

On this occasion, if diamond seed crystal 10 is of n type with a multiplicity of donor atoms such as nitrogen atoms or phosphorus atoms, a band is increased near the hydrogen-terminated surface, with the result that emission of secondary electrons may be hindered. Hence, even when a type Ib single-crystal diamond is used as the diamond seed crystal, seed crystal damage points 10di can be observed but the donor density of diamond seed crystal 10 is preferably not more than 30 ppm and is preferably not more than 1 ppm. As the diamond seed crystal, it is preferable to use a type IIa single-crystal diamond or a single-crystal diamond grown by CVD.

The sub step of forming conductive layer region 10c at the main surface 10m side of diamond seed crystal 10 can be performed by implanting ions into the main surface 10m side of diamond seed crystal 10. For the ions, carbon ions, hydrogen ions, lithium ions, boron ions, nitrogen ions, oxygen ions, or phosphorus ions are preferably used.

(Step of Growing Single-Crystal Diamond)

With reference to FIG. 5 (B), the step of growing single-crystal diamond 20 is performed by growing single-crystal diamond 20 on main surface 10m of diamond seed crystal 10 by chemical vapor deposition (CVD). As the CVD, microwave plasma CVD, DC plasma CVD, hot filament CVD, and the like are used suitably. As single crystal growth gas, hydrogen, methane, argon, nitrogen, oxygen, carbon dioxide, or the like are used. The concentration of nitrogen atoms in the single-crystal diamond is not particularly limited and may be not less than 1 ppm or less than 1 ppm but is preferably adjusted to be not less than 3 ppm or not more than 0.3 ppm. Further, a doping gas may be added, such as diborane, trimethylboron, phosphine, tertiary butylphosphorus, or silane. In a region in which the thickness of single-crystal diamond 20 is 1 μm to 7 μm at an initial state of crystal growth, it is preferable to grow it under conditions that at least a growth parameter ($\alpha$) is not less than 2 and the temperature of diamond seed crystal 10 is not more than 1100° C. The growth parameter ($\alpha$) refers to a value obtained by multiplying, by $3^{0.5}$, a ratio of the rate of crystal growth in the <100> direction to the rate of crystal growth in the <111> direction.

The thickness of single-crystal diamond 20 to be grown is not particularly limited but is preferably not less than 300 μm and is more preferably not less than 500 μm in order to suitably form a cutting tool, a polishing tool, an optical component, an electronic component, a semiconductor material, and the like. The thickness of single-crystal diamond 20 is preferably not more than 1500 μm and is more preferably not more than 1000 μm in order to prevent cracks from being generated in diamond seed crystal 10 due to stress. In the case of growing single-crystal diamond 20 having a thickness of more than 1000 μm, it is preferable to grow second single-crystal diamond layer 22 on first single-crystal diamond layer 21 as an additional single-crystal diamond 20 after growing first single-crystal diamond layer 21 having a thickness of not more than 500 μm and then removing diamond seed crystal 10 as described below.

It should be noted that in the case of growing single-crystal diamond 20 including the plurality of single-crystal diamond layers 21, 22 as shown in FIG. 4, first single-crystal diamond layer 21 and second single-crystal diamond layer 22 can be continuously grown on diamond seed crystal 10 as single-crystal diamond 20. However, in the case of growing single-crystal diamond 20 having a large thickness (for example, thickness of more than 1000 μm), it is preferable that first single-crystal diamond layer 21 having a thickness of not more than 500 μm is grown, then diamond seed crystal 10 is removed, and then second single-crystal diamond layer 22 is additionally grown, in order to prevent diamond seed crystal 10 from being broken due to stress resulting from the large thickness of single-crystal diamond 20.

(Step of Removing Diamond Seed Crystal)

With reference to FIG. 5 (C), in order to obtain single-crystal diamond 20 efficiently, the method of producing single-crystal diamond 20 of the present embodiment can further include a step of removing diamond seed crystal 10.

In the step of removing diamond seed crystal 10, diamond seed crystal 10 is preferably removed by laser cutting in order to remove diamond seed crystal 10 efficiently. On the other hand, diamond seed crystal 10 is preferably removed by employing electrochemical etching such as electrolytic etching to decompose conductive layer region 10c formed by implanting ions to diamond seed crystal 10.

(Step of Additionally Growing Single-Crystal Diamond)

With reference to FIG. 5 (D), in order to obtain single-crystal diamond 20 in which occurrence of large chipping is further suppressed, the method of producing single-crystal diamond 20 in the present embodiment can further include a step of additionally growing a single-crystal diamond 20.

The step of additionally growing single-crystal diamond 20 is performed by growing second single-crystal diamond layer 22 by CVD on the main surface of first single-crystal diamond layer 21, which is single-crystal diamond 20 having been already grown. In first single-crystal diamond layer 21, crystal defect lines 21dq having defects transferred from seed crystal defect points 10dp of main surface 10m of diamond seed crystal 10 extend in the crystal growth direction as shown in FIG. 5 (C). In second single-crystal diamond layer 22 grown by CVD on first single-crystal diamond layer 21, crystal defect points 20dp are tip points of crystal defect lines 22dq that have defects transferred from crystal defect lines 21dq and that extend in the crystal growth direction to reach crystal growth main surface 20m of single-crystal diamond 20.

On this occasion, generally, in first single-crystal diamond layer 21, a plurality of crystal defect lines 21dq are transferred from one seed crystal defect point 10dp of diamond seed crystal 10, and in second single-crystal diamond layer 22, a plurality of crystal defect lines 22dq are transferred from one crystal defect line 21dq of diamond seed crystal 10. Hence, as the number of single-crystal diamond layers 21, 22 are increased, the number of crystal defect points 20dp of single-crystal diamond 20 is increased, thereby further suppressing occurrence of large chipping.

In the manner described above, single-crystal diamond 20 is obtained which includes the plurality of single-crystal diamond layers 21, 22, wherein crystal defect lines 21dq, 22dq are newly generated or branched at interface 212i between single-crystal diamond layers 21, 22, and the density of crystal defect points 20dp of crystal growth main surface 20m is higher than the density of crystal defect points 20ndp of main surface 20n opposite to crystal growth main surface 20m.

Moreover, with reference to FIG. 5 (C) and FIG. 6, the step of additionally growing single-crystal diamond 20 can be performed by growing an additional single-crystal diamond by CVD on main surface 20n opposite to crystal growth main surface 20m of single-crystal diamond 20 obtained in FIG. 5 (C). In this way, as shown in FIG. 6, single-crystal diamond 20 is obtained which includes the plurality of single-crystal diamond layers 20a, 20b, wherein crystal defect lines 20adq, 20bdq are newly generated, disappeared, branched or merged at interface 20i between single-crystal diamond layers 20a, 20b, and the densities of crystal defect points 20adp of crystal growth main surface 20am and crystal defect points 20bdp of crystal growth main surface 20bm opposite to crystal growth main surface 20am are higher than the density of the crystal defect points at interface 20i between single-crystal diamond layers 20a, 20b.

Moreover, with reference to FIG. 5 (D) and FIG. 7, the step of additionally growing single-crystal diamond 20 can be performed by growing an additional single-crystal diamond by CVD on main surface 20n opposite to crystal growth main surface 20m of single-crystal diamond 20 obtained in FIG. 5 (D). In this way, as shown in FIG. 7, single-crystal diamond 20 is obtained which includes the plurality of single-crystal diamond layers 21a, 21b, 22a, 22b, wherein crystal defect lines 21adq, 21bdq, 22adq, 22bdq are newly generated, disappeared, branched or merged at interfaces 20i, 212ai, 212bi between single-crystal diamond layers 21a, 21b, 22a, 22b, and the densities of crystal defect points 20adp of crystal growth main surface 20am and crystal defect points 20bdp of crystal growth main surface 20bm opposite to crystal growth main surface 20am are higher than the density of the crystal defect points at interfaces 20i, 212ai, 212bi between single-crystal diamond layers 21a, 21b, 22a, 22b.

Third Embodiment: Tool

A tool of the present embodiment is a tool selected from a group consisting of a cutting bite, a milling cutter wiper, an end mill, a drill, a reamer, a cutter, a dresser, a wire guide, a wire drawing die, a water jet nozzle, a diamond knife, a glass cutter and a scriber, the tool including the single-crystal diamond of the first embodiment at a contact portion with a workpiece. Since such a tool includes the single-crystal diamond of the above-described embodiment at the contact portion with the workpiece, large chipping is suppressed, chipping resistance is high, and strength is high.

Fourth Embodiment: Components

A component of the present embodiment is a component selected from a group consisting of an optical component, a heat sink, a biochip, a sensor, and a semiconductor substrate, the component including the single-crystal diamond of the first embodiment. Since such a component includes the single-crystal diamond of the above-described embodiment, large chipping is suppressed, chipping resistance is high, and strength is high.

EXAMPLES

Example 1

(Samples 1 to 5 and Samples 9 to 12)

1. Preparation of Diamond Seed Crystal Having Seed Crystal Defect Line-Like Gathered Region at Main Surface With reference to FIG. 5 (A), as diamond seed crystal 10, nine diamond seed crystal substrates each having a size of 5 mm×5 mm×1 mm (thickness) were prepared. Each of the nine diamond seed crystal substrates grown by the high-temperature/high-pressure method had main surface 10m having an off angle of 2° to 10° relative to the (001) plane in the <100> direction.

In each of samples 1 to 5 and 9, by using a grindstone obtained by fixing diamond abrasive grains having an average grain size of 9 μm to 35 μm using a metal, scratches extending in the form of lines in the <100> direction were formed at main surface 10m of diamond seed crystal 10 as the seed crystal defect line-like gathered regions under the following conditions: a rotating speed of 500 rpm to 3000 rpm; and a load of 0.5 kgf to 5 kgf. Next, for sample 9, the densities of the seed crystal defect points and the seed crystal damage points were adjusted by dry-etching main surface 10m of diamond seed crystal 10 using oxygen ($O_2$) gas and hydrogen tetrafluoride ($CF_4$) gas.

For each of samples 10 to 12, diamond seed crystal 10 was washed with an acid (aqua regia) and an organic solvent (ethanol), Al to serve as a mask was deposited on main surface 10m, a photo mask in the form of lines was formed by photolithography, and acid treatment was performed using dilute hydrochloric acid to remove Al from locations to be the seed crystal defect line-like gathered regions, thereby forming an Al mask. Next, in an atmosphere with a decreased pressure of 0.1 Pa to 10 Pa, dry etching was performed using oxygen, thereby forming needlelike projections, each having a height of 10 nm to 500 nm, in the seed crystal defect line-like gathered regions. Then, Al was removed by acid treatment using dilute hydrochloric acid.

Next, based on an X-ray topography image captured in the transmission type in the direction perpendicular to main surface 10m of each diamond seed crystal 10 having the seed crystal defect line-like gathered regions formed therein, calculation was performed to determine: a line density (the number·mm$^{-1}$) in the direction perpendicular to the direction in which the seed crystal defect line-like gathered regions extended in the form of lines; a maximum interval (μm) between the seed crystal defect line-like gathered regions in the direction in which the seed crystal defect line-like gathered regions extended in the form of lines; a density (the number·cm$^{-2}$) of seed crystal defect line-like gathered regions each having a length of not less than 300 μm; a density (the number·cm$^{-2}$) of seed crystal defect line-like gathered regions each having a length of not less than 500 μm; and a density (mm$^{-2}$) of the seed crystal defect points. Further, hydrogen plasma generated by introducing microwave was emitted to main surface 10m of diamond seed crystal 10 to hydrogen-terminate main surface 10m of each diamond seed crystal 10 provided with the seed crystal defect line-like gathered regions, and then the density (mm$^{-2}$) of seed crystal damage points 10di was calculated based on a secondary electron image obtained by detecting, as secondary electrons, carriers excited by primary electrons of an electron microscope. Results thereof are shown in Table 1.

Next, in each of samples 1 to 5 and samples 9 to 12, carbon ions were implanted into the main surface 10m side of diamond seed crystal 10 provided with the seed crystal defect line-like gathered regions, with an energy of 300 keV to 3 MeV and a dose amount of $1 \times 10^{15}$ cm$^{-2}$ to $1 \times 10^{18}$ cm$^{-2}$, thereby forming conductive layer region 10c.

2. Growth of Single-Crystal Diamond

Next, with reference to FIG. 5 (B), microwave plasma CVD was employed to grow single-crystal diamond 20 on main surface 10m of each diamond seed crystal 10 provided with the seed crystal defect line-like gathered regions. For crystal growth gas, hydrogen gas, methane gas, and nitrogen gas were used. The concentration of the methane gas relative to the hydrogen gas was set at 5 mol % to 20 mol %, and the concentration of the nitrogen gas relative to the methane gas was set at 0 mol % to 5 mol %. A crystal growth pressure was set at 5 kPa to 15 kPa, and a crystal growth temperature (temperature of the diamond seed crystal) was set at 800° C. to 1200° C.

3. Removal of Diamond Seed Crystal

Next, with reference to FIG. 5 (C), in each of samples 1 to 5, diamond seed crystal 10 was removed from single-crystal diamond 20 by performing electrolytic etching to decompose conductive layer region 10c in diamond seed crystal 10. In each of samples 9 to 12, the seed crystal was removed using a Nd:YAG laser and the resulting cut surface was polished using a grindstone obtained by fixing diamond abrasive grains using a metal.

Based on an X-ray topography image measured in the transmission type in the direction perpendicular to crystal growth main surface 20m, which corresponds to the (001) plane, of each of single-crystal diamonds 20 thus obtained, calculation was performed to determine: a line density (the number·mm$^{-1}$) in the direction perpendicular to the direction in which the crystal defect line-like gathered regions extended in the form of lines; a maximum interval (μm) between the crystal defect line-like gathered regions in the direction in which the seed crystal defect line-like gathered regions extended in the form of lines; a density (the number·cm$^{-2}$) of crystal defect line-like gathered regions each having a length of not less than 300 μm; a density (the number·cm$^{-2}$) of crystal defect line-like gathered regions each having a length of not less than 500 μm; a density (mm$^{-2}$) of the crystal defect points; and a density (mm$^{-2}$) of the combined dislocation points. Here, the diffraction plane for X rays was set at the (220) plane. The energy of the X rays used was 14.547 keV (wavelength of 0.85 Å). Results thereof are shown in Table 1. Regarding the values of the columns of the density of the crystal defect points and the density of the combined dislocation points in sample 12 in Table 1, one of the values was the value at the crystal growth main surface and the other was the value at the crystal growth main surface opposite thereto.

4. Additional Growth of Single-Crystal Diamond

Next, with reference to FIG. 5 (D), a single-crystal diamond 20 was additionally grown in each of samples 2 to 5 and samples 10 to 12. Crystal growth conditions in the additional growth were the same as the initial crystal growth conditions described above. Single-crystal diamonds 20 of samples 2 to 5 and samples 10 to 12 thus obtained respectively have three single-crystal diamond layers, two single-crystal diamond layers, five single-crystal diamond layers, three single-crystal diamond layers, three single-crystal diamond layers, five single-crystal diamond layers, and three single-crystal diamond layers. Furthermore, with reference to FIG. 7, in sample 12, the main surface having been cut by the laser was polished and washed with an acid (aqua regia), and then oxygen ($O_2$) gas and hydrogen tetrafluoride ($CF_4$) gas were used to perform dry etching, thereby additionally growing a single-crystal diamond constituted of two single-crystal diamond layers. Crystal growth conditions in the additional growths were the same as the initial crystal growth conditions described above. Results thereof are shown in Table 1.

5. Evaluation on Physical Property of Single-Crystal Diamond

Based on an X-ray topography image measured in the transmission type in the direction perpendicular to crystal growth main surface 20m, which corresponds to the (001) plane, of each of single-crystal diamonds 20 thus obtained, calculation was performed to determine: a line density (the number·mm$^{-1}$) in the direction perpendicular to the direction in which the crystal defect line-like gathered regions extended in the form of lines; a maximum interval (μm) between the crystal defect line-like gathered regions in the direction in which the crystal defect line-like gathered regions extended in the form of lines; a density (the number·cm$^{-2}$) of crystal defect line-like gathered regions each having a length of not less than 300 μm; a density (the number·cm$^{-2}$) of crystal defect line-like gathered regions each having a length of not less than 500 μm; a density (mm$^{-2}$) of crystal defect points; and a density (mm$^{-2}$) of the combined dislocation points. Here, the diffraction plane for X rays was set at the (220) plane. The energy of the X rays used was 14.547 keV (wavelength of 0.85 Å). Results thereof are shown in Table 1.

6. Evaluation on Chipping Resistance of Single-Crystal Diamond

Each of single-crystal diamonds 20 obtained as above was processed into the shape of a cutter edge, and a workpiece was cut therewith to evaluate chipping resistance. For a cutter, RF4080R provided by Sumitomo Electric Industries HardMetal was used. For a wiper chip, SNEW1204ADFR-WS provided by Sumitomo Electric Industries HardMetal was used. As a lathe, NV5000 provided by MOM SEIKI was used. Cutting speed was set at 2000 m/min, an amount of cut was set at 0.05 mm, and an amount of feed was set at 0.05 mm/cutting edge. For the workpiece, an aluminum material A5052 was used. After cutting the workpiece for 30 km, chipping resistance was evaluated based on the number of chippings of not less than 5 μm in the cutter edge. As the number of chippings is smaller, chipping resistance is higher. Results thereof are shown in Table 1.

(Samples 6 to 8)

For comparison, the three single-crystal diamonds grown by the high-temperature/high-pressure method were evaluated in terms of chipping resistance in a manner similar to samples 1 to 5. These results are also shown in Table 1.

TABLE 1

| | | | Sample 1 | Sample 2 | Sample 3 | Sample 4 | Sample 5 | Sample 6 |
|---|---|---|---|---|---|---|---|---|
| Seed Crystal | Seed Crystal Defect Line-Like Gathered Region | Line Density (The Number · mm$^{-1}$) | 4 | 4 | 2 | 9 | 4 | — |
| | | Maximum Interval (μm) | 255 | 240 | 490 | 65 | 220 | — |
| | | Length of Not Less Than 300 μm Density (The Number · mm$^{-2}$) | 102 | 154 | 42 | 320 | 120 | — |
| | | Length of Not Less Than 500 μm Density (The Number · cm$^{-2}$) | 66 | 82 | 10 | 110 | 72 | — |
| | Density of Seed Crystal Defect Points (mm$^{-2}$) | | 800 | 900 | 290 | 1200 | 300 | — |
| | Density of Seed Crystal Damage Points (mm$^{-2}$) | | 270 | 400 | 120 | 500 | 140 | — |
| Single Crystal | Crystal Defect Line-Like Gathered Region | Line Density (The Number · mm$^{-1}$) | 4 | 4 | 2 | 9 | 4 | 0 |
| | | Maximum Interval (μm) | 245 | 230 | 475 | 60 | 210 | — |
| | | Length of Not Less Than 300 μm Density (The Number · cm$^{-2}$) | 102 | 154 | 42 | 320 | 120 | — |
| | | Length of Not Less Than 500 μm Density (The Number · cm$^{-2}$) | 66 | 82 | 10 | 110 | 72 | — |
| | Density of Crystal Defect Points (mm$^{-2}$) | | 1700 | 6100 | 1200 | 38000 | 4000 | 300 |
| | Density of Combined Dislocation Points (mm$^{-2}$) | | 800 | 2000 | 400 | 13000 | 1800 | 90 |
| | The Number of Single-Crystal Diamond Layers | | 1 | 3 | 2 | 5 | 3 | 1 |
| | Thickness of Single-Crystal Diamond (μm) | | 600 | 1500 | 1000 | 3100 | 1500 | 1000 |
| | Concentration of Nitrogen Atoms (ppm) | | 30 | 40 | 35 | 50 | 0.02 | 30 |
| | Transmittance for 400-nm Light (%) | | 2.1 | <0.5 | 0.9 | <0.5 | 54.3 | 1.3 |
| Chipping Resistance | The Number of Chippings | | 0 | 0 | 0 | 0 | 0 | 5 |

| | | | Sample 7 | Sample 8 | Sample 9 | Sample 10 | Sample 11 | Sample 12 |
|---|---|---|---|---|---|---|---|---|
| Seed Crystal | Seed Crystal Defect Line-Like Gathered Region | Line Density (The Number · mm$^{-1}$) | — | — | 3 | 6 | 6 | 5 |
| | | Maximum Interval (μm) | — | — | 190 | 180 | 230 | 290 |
| | | Length of Not Less Than 300 μm Density (The Number · mm$^{-2}$) | — | — | 92 | 280 | 264 | 220 |
| | | Length of Not Less Than 500 μm Density (The Number · cm$^{-2}$) | — | — | 48 | 190 | 172 | 84 |
| | Density of Seed Crystal Defect Points (mm$^{-2}$) | | — | — | 11 | 950 | 1200 | 850 |
| | Density of Seed Crystal Damage Points (mm$^{-2}$) | | — | — | 4 | 550 | 500 | 390 |
| Single Crystal | Crystal Defect Line-Like Gathered Region | Line Density (The Number · mm$^{-1}$) | 1 | 0 | 3 | 6 | 6 | 5 |
| | | Maximum Interval (μm) | 440 | — | 187 | 174 | 217 | 279 |
| | | Length of Not Less Than 300 μm Density (The Number · cm$^{-2}$) | — | — | 92 | 280 | 264 | 220 |
| | | Length of Not Less Than 500 μm Density (The Number · cm$^{-2}$) | — | — | 48 | 190 | 172 | 84 |
| | Density of Crystal Defect Points (mm$^{-2}$) | | 900 | 280 | 25 | 7200 | 42000 | 5900/1700 |
| | Density of Combined Dislocation Points (mm$^{-2}$) | | 150 | 80 | 22 | 4500 | 12000 | 1800/900 |
| | The Number of Single-Crystal Diamond Layers | | 1 | 1 | 1 | 3 | 5 | 5 |
| | Thickness of Single-Crystal Diamond (μm) | | 1000 | 3000 | 800 | 2500 | 3100 | 3500 |
| | Concentration of Nitrogen Atoms (ppm) | | 20 | 20 | 90 | 2 | 0.8 | 7 |
| | Transmittance for 400-nm Light (%) | | 2.4 | <0.5 | <0.5 | 17 | 31 | 7.2 |

TABLE 1-continued

| | | | | | | | |
|---|---|---|---|---|---|---|---|
| Chipping Resistance | The Number of Chippings | 2 | 9 | 0 | 0 | 0 | 0 |

With reference to Table 1, in each of samples 1 to 5 and samples 9 to 12, the number of chippings after the cutting was 0, and the chipping resistance was thus very high. On the other hand, in each of samples 6 to 8, the number of chippings after the cutting was 2 to 9, and chipping resistance was thus low.

Example 2

Next, in each of samples 13 to 15, a seed crystal was prepared in a manner similar to that in Example 1, a single-crystal diamond was grown as in Table 2 under a low nitrogen concentration. For crystal growth gas, hydrogen gas, methane gas, and carbon dioxide gas were used. The concentration of the methane gas relative to the hydrogen gas was set at 1 mol % to 20 mol %, and the concentration of the carbon dioxide gas relative to the methane gas was set at 1 mol % to 70 mol %. A crystal growth pressure was set at 5 kPa to 30 kPa, and a crystal growth temperature (temperature of the diamond seed crystal) was set at 800° C. to 1200° C. After separating the seed substrate in a manner similar to that in Example 1, analysis and additional growth were performed in a manner similar to those in Example 1. Each of the obtained single-crystal diamonds was processed into a disc shape and was attached to a flange, thereby producing a window for $CO_2$ laser. For comparison, a window was produced using ZnSe coated with AR. After repeating processing with 40 kW of oscillator output of the laser for 2000 hours, a surface of the window material was observed. A laser output with the single-crystal diamond upon starting the use thereof and a laser output with the single-crystal diamond after the use thereof were measured by a power meter. Results thereof are shown in Table 2.

laser output upon the end of the use was decreased to 79% of the laser output upon starting the use. It was found that an end portion thereof was changed into a black color. It was found that a part of the diamond was graphitized due to a crack generated by thermal shock, thus resulting in decreased transmittance. In the ZnSe for comparison, with a passage of 700 hours, the laser output was abruptly decreased to 50% of the laser output upon starting the use. Hence, the laser output was stopped and surface analysis was performed, thus finding that the entire AR coat was peeled off and surface roughness was caused due to heat.

The embodiments and examples disclosed herein are illustrative and non-restrictive in any respect. The scope of the present invention is defined by the terms of the claims, rather than the descriptions above, and is intended to include any modifications within the scope and meaning equivalent to the terms of the claims.

REFERENCE SIGNS LIST

10: diamond seed crystal; 10*c*: conductive layer region; 10*dp*: seed crystal defect point; 10*dd*: seed crystal dislocation point; 10*di*: seed crystal damage point; 10*dv*: seed crystal chipping point; 10*m*, 20*n*: main surface; 20: single-crystal diamond; 20*d*, 20*ad*, 20*bd*: crystal defect; 20*dp*, 20*adp*, 20*bdp*, 20*ndp*: crystal defect point; 20*dq*, 20*adq*, 20*bdq*, 21*adq*, 21*bdq*, 22*adq*, 22*bdq*: crystal defect line; 20*i*, 212*i*, 212*ai*, 212*bi*: interface; 20*m*, 20*am*, 20*bm*: crystal growth main surface; 20*r*: crystal defect line-like gathered region; 20*a*, 20*b*, 21, 21*a*, 21*b*, 22, 22*a*, 22*b*: single-crystal diamond layer.

TABLE 2

| | | | Sample 13 | Sample 14 | Sample 15 | AR-Coated ZnSe |
|---|---|---|---|---|---|---|
| Seed Crystal | Seed Crystal Defect Line-Like Gathered Region | Line Density (The Number · $mm^{-1}$) | 2 | 5 | — | — |
| | | Maximum Interval (μm) | 490 | 310 | — | — |
| | | Length of Not Less Than 300 μm Density (The Number · $cm^{-2}$) | 44 | 234 | — | — |
| | | Length of Not Less Than 500 μm Density (The Number · $cm^{-2}$) | 12 | 76 | — | — |
| | Density of Seed Crystal Defect Points ($mm^{-2}$) | | 1100 | 920 | — | |
| | Density of Seed Crystal Damage Points ($mm^{-2}$) | | 510 | 390 | — | |
| Single Crystal | Crystal Defect Line-Like Gathered Region | Line Density (The Number · $mm^{-1}$) | 2 | 5 | 0 | — |
| | | Maximum Interval (μm) | 490 | 310 | — | — |
| | | Length of Not Less Than 300 μm Density (The Number · $cm^{-2}$) | 44 | 234 | — | — |
| | | Length of Not Less Than 500 μm Density (The Number · $cm^{-2}$) | 12 | 76 | — | — |
| | Density of Crystal Defect Points ($mm^{-2}$) | | 1300/1300 | 6200/3300 | 120 | — |
| | Density of Combined Dislocation Points ($mm^{-2}$) | | 500/510 | 2100/1200 | 70 | — |
| | The Number of Single-Crystal Diamond Layers | | 4 | 5 | 1 | — |
| | Thickness of Single-Crystal Diamond (μm) | | 3000 | 3000 | 3000 | — |
| | Concentration of Nitrogen Atoms (ppm) | | 14 | 1.0 | 230 | — |
| Output After 2000 Hours (%) | | | 100 | 100 | 79 | 50 (After Passage of 700 Hours) |

With reference to Table 2, in each of samples 13, 14, the laser output after the use was unchanged at all, i.e., was 100% of the laser output upon starting the use, and excellent transmittance was therefore maintained. In sample 15, the

The invention claimed is:

1. A single-crystal diamond, wherein in an X-ray topography image for a crystal growth main surface of the single-crystal diamond, a plurality of crystal defect line-like gathered regions exist in parallel, and in the plurality of crystal defect line-like gathered regions, groups of crystal defect points are gathered to extend in a form of lines in a direction angled by not more than 30° relative to one arbitrarily specified direction, each of the crystal defect points being a tip point of a crystal defect line reaching the crystal growth main surface, the crystal defect line representing a line in which a crystal defect exists, wherein a density of the crystal defect points is more than 20 $mm^{-2}$.

2. The single-crystal diamond according to claim 1, wherein two or more crystal defect line-like gathered regions exist for every 1 mm in a direction perpendicular to a direction in which the crystal defect line-like gathered regions extend in the form of lines, and an interval between the crystal defect line-like gathered regions is not more than 500 μm in the direction in which the crystal defect line-like gathered regions extend in the form of lines.

3. The single-crystal diamond according to claim 1, wherein the crystal defect line-like gathered regions include five or more crystal defect line-like gathered regions each having a long length of not less than 300 μm for every 1 $cm^2$ at the crystal growth main surface.

4. The single-crystal diamond according to claim 1, wherein a density of combined dislocation points of the crystal defect points is more than 20 $mm^{-2}$, each of the combined dislocation points being a tip point of a combined dislocation reaching the crystal growth main surface, the combined dislocation resulting from a combination of at least either of a plurality of edge dislocations and a plurality of screw dislocations.

5. The single-crystal diamond according to claim 1, comprising a plurality of single-crystal diamond layers.

6. The single-crystal diamond according to claim 5, wherein the crystal defect line is newly generated or branched at an interface between the single-crystal diamond layers, and a density of the crystal defect points of the crystal growth main surface is higher than a density of the crystal defect points of a main surface opposite to the crystal growth main surface.

7. The single-crystal diamond according to claim 5, wherein the crystal defect line is newly generated, disappeared, branched or merged at an interface between the single-crystal diamond layers, and densities of the crystal defect points of the crystal growth main surface and the crystal defect points of a crystal growth main surface opposite to the crystal growth main surface are higher than a density of the crystal defect points at the interface between the single-crystal diamond layers.

8. The single-crystal diamond according to claim 1, comprising not less than 1 ppm of nitrogen atoms as impurity atoms.

9. The single-crystal diamond according to claim 1, comprising less than 1 ppm of nitrogen atoms as impurity atoms.

10. The single-crystal diamond according to claim 1, wherein a transmittance for 400-nm light is not more than 60% when the single-crystal diamond has a thickness of 500 μm.

11. The single-crystal diamond according to claim 1, wherein the arbitrarily specified direction in which groups of crystal defect lines are gathered to extend in the form of lines is the <001> or the <110> direction, and the crystal growth main surface corresponds to the (001) plane.

12. A tool selected from a group consisting of a cutting bite, a milling cutter wiper, an end mill, a drill, a reamer, a cutter, a dresser, a wire guide, a wire drawing die, a water jet nozzle, a diamond knife, a glass cutter, and a scriber, the tool including the single-crystal diamond recited in claim 1 at a contact portion with a workpiece.

13. A component selected from a group consisting of an optical component, a heat sink, a biochip, a sensor, and a semiconductor substrate, the component including the single-crystal diamond recited in claim 1.

* * * * *